United States Patent [19]
Maltby et al.

[11] Patent Number: 5,539,670
[45] Date of Patent: Jul. 23, 1996

[54] COATING RESPONSIVE MATERIAL CONDITION MONITORING SYSTEM

[75] Inventors: Frederick L. Maltby, Jenkintown; L. Jonathan Kramer, Warminster; Steven R. Petersen, Dresher, all of Pa.

[73] Assignee: Drexelbrook Controls, Inc., Horsham, Pa.

[21] Appl. No.: 208,928

[22] Filed: Mar. 10, 1994

Related U.S. Application Data

[63] Continuation of Ser. No. 78,799, Jun. 16, 1993, abandoned, which is a continuation of Ser. No. 864,161, Apr. 2, 1992, abandoned, which is a continuation of Ser. No. 708,107, May 28, 1991, abandoned, which is a continuation of Ser. No. 560,007, Jul. 25, 1990, abandoned, which is a continuation of Ser. No. 236,904, Aug. 25, 1988, abandoned, which is a continuation-in-part of Ser. No. 113,358, Oct. 23, 1987, Pat. No. 4,799,174, which is a continuation of Ser. No. 839,794, Mar. 13, 1986, abandoned.

[51] Int. Cl.⁶ .................................................. G01F 23/26
[52] U.S. Cl. .......................... 364/550; 364/509; 364/563; 324/648; 73/304 R; 340/612
[58] Field of Search .................................... 364/550, 562, 364/563, 509, 481, 482, 551.01; 340/603, 612; 73/304 C, 291, 1 H, 304 R; 324/648, 651, 657

[56] References Cited

U.S. PATENT DOCUMENTS

| | | | |
|---|---|---|---|
| 3,810,007 | 5/1974 | Wiseman et al. | 324/62 |
| 4,638,305 | 1/1987 | Sutton | 73/304 C |
| 4,676,100 | 6/1987 | Eichberger | 73/1 H |
| 4,676,101 | 6/1987 | Baughman | 73/304 C |
| 4,686,857 | 8/1987 | Kato | 73/304 C |
| 4,749,988 | 6/1988 | Berman et al. | 73/304 C |
| 4,757,252 | 7/1988 | Maltby et al. | 73/304 C |
| 4,799,174 | 1/1989 | Kramer et al. | 364/550 |
| 4,800,755 | 1/1989 | Fathauer et al. | 73/1 H |
| 4,803,428 | 2/1989 | Crostack | 364/563 |

*Primary Examiner*—Michael Zanelli

[57] ABSTRACT

A multiple set point material condition monitoring system is responsive both to the level of material with respect to a sensor and the extent of material coating which has accumulated on the sensor. The system provides an output when a predetermined coating thickness has been exceeded, so that the sensor may be cleaned before the coating can accumulate to the extent where a false level output is generated. The systems include three electrode guarded sensors, a bridge comparing the sensor output with a reference, and a bridge reference which is automatically and repeatedly caused to assume a sequence of values corresponding to material condition set points, one of which causes an output when a predetermined coating thickness has occurred and another of which generates a level output. In one embodiment, separate outputs are provided corresponding to each set point. In another embodiment, a single tri-state output is responsive to both set points.

18 Claims, 17 Drawing Sheets

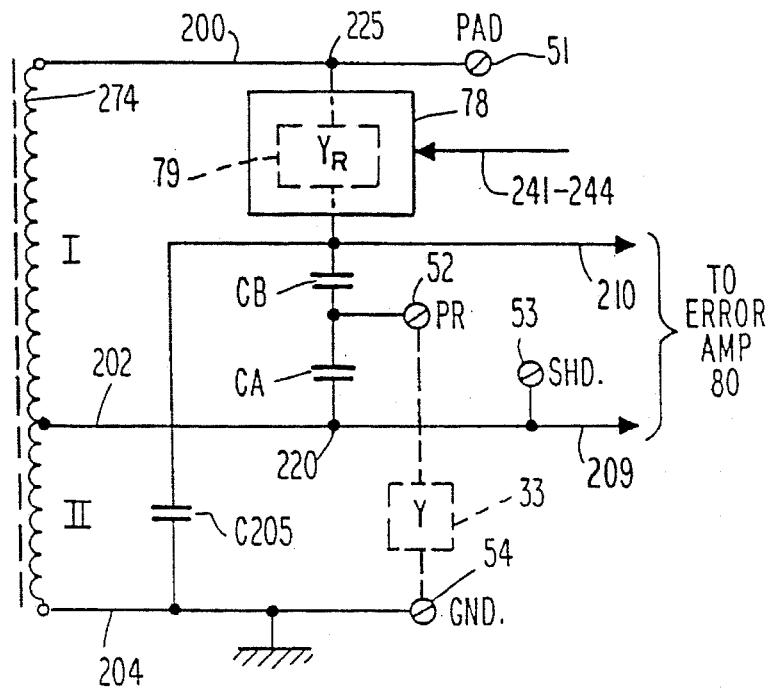
*Fig. 4*
*Fig. 5*
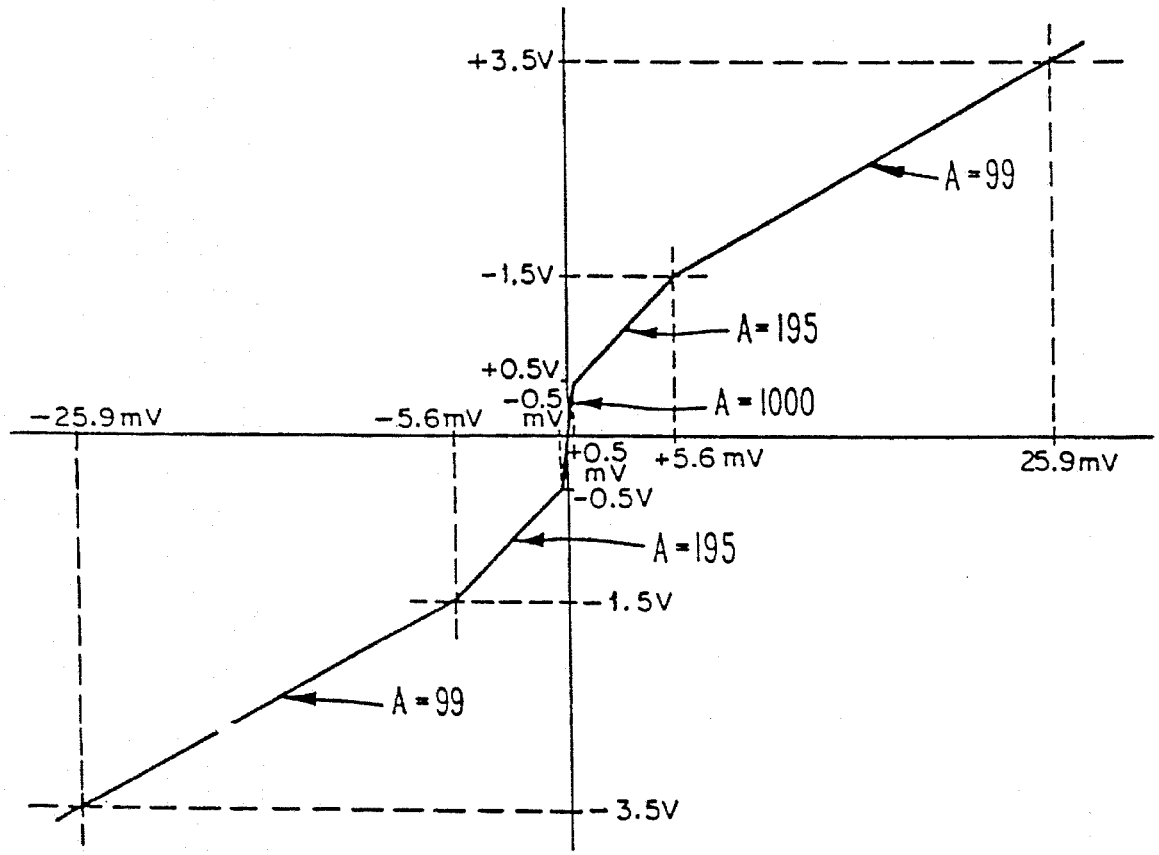
*Fig. 6*

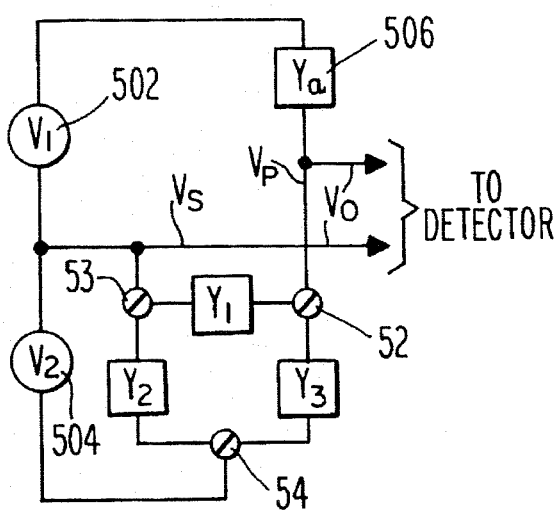
_Fig. 8a_
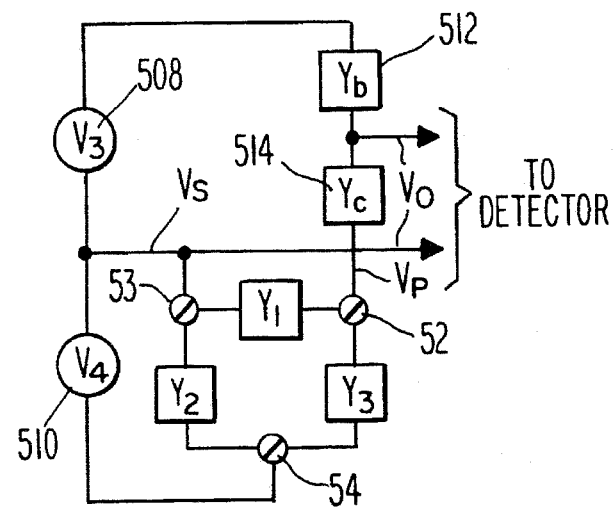
_Fig. 8b_
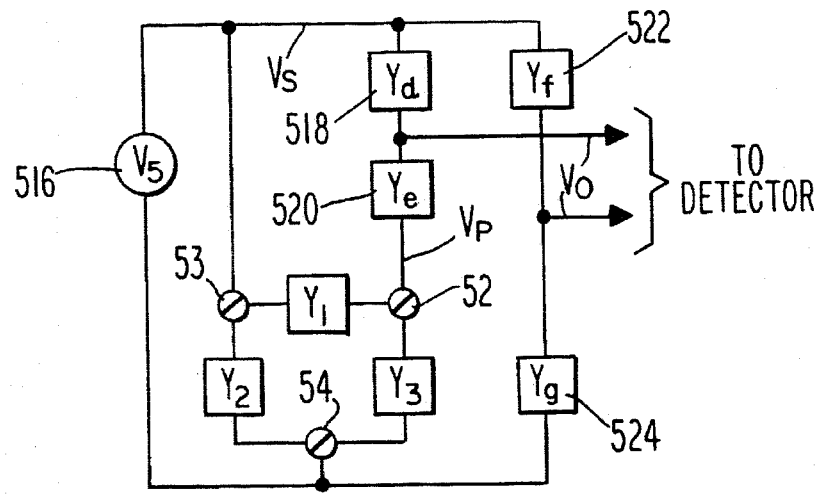
_Fig. 8c_
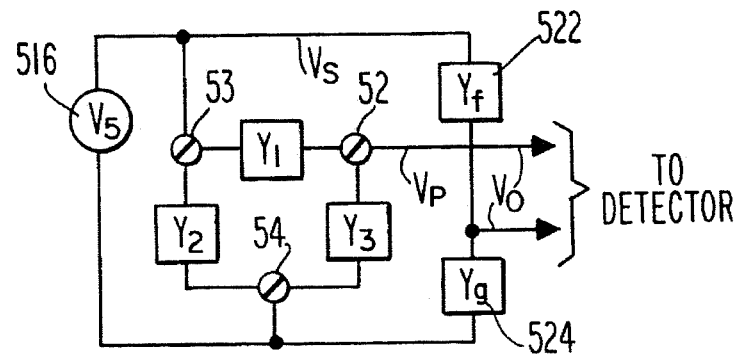
_Fig. 8d_

COATING RESPONSIVE MATERIAL CONDITION MONITORING SYSTEM

This application is a Continuation of Ser. No. 08/078, 799, filed Jun. 16, 1993, which is a Continuation of Ser. No. 07/864,161, filed Apr. 2, 1992, which is a Continuation of Ser. No. 07/708,107, filed May 28, 1991, which is a Continuation of Ser. No. 07/560,007, filed Jul. 25, 1990, which is a Continuation of Ser. No. 07/236,904, filed Aug. 25, 1988, all of which are abandoned, which is a Continuation-in-part in-part of Ser. No. 07/113,358, filed Oct. 23, 1987, now U.S. No. Pat. 4,799,174, which is a Continuation of Ser. No. 06/839,794, filed Mar. 13, 1986, now abandoned.

BACKGROUND OF THE INVENTION

1. Field of the Invention

This invention relates to systems for monitoring the condition of materials. More particularly, this invention relates to condition monitoring systems which are responsive to a plurality of material conditions. Still more particularly, this invention relates to condition monitoring systems which may be used to monitor materials which can leave a coating on condition—responsive apparatus. Even more particularly, this invention relates to condition monitoring systems providing an output relating to the degree to which the condition—responsive apparatus is coated.

2. Description of the Prior Art

Many systems are known which are responsive to the condition of materials, such as the presence or absence of materials at a monitored location. Such systems are often used as level controls, e.g. level switches including high level alarms. One well-known monitoring technique for high-level alarms involves positioning a material responsive sensor including a measuring electrode in a vessel and monitoring the electrical properties of that electrode with respect to a reference electrode, usually the grounded vessel wall. Such monitoring is usually of the conductive and/or susceptive portions of the admittance between the electrodes, and may be performed in a radio frequency bridge or other admittance—responsive circuit. Such monitoring operates on the principle that there is a detectable increase in admittance between the electrodes, with respect to its empty—vessel value, when the material level increases to cover the measuring electrode.

However, it has long been recognized that such admittance—responsive systems are subject to erroneous high-level indications, which result from the fact that the admittance presented to the sensor by a coating of material may be substantially as large as the admittance presented when the sensor is fully covered. To minimize this effect, systems have been devised which have the capacity to ignore substantial coating of the sensor. Such a system is disclosed in U.S. Pat. No. 3,706,980 and involves the use of a "guard" (or "shield") electrode disposed between the measuring electrode and the reference electrode, which guard is driven at substantially the potential of the measuring electrode to reduce surface leakage current along the sensor. However, such systems are still subject to a false high-level indication; when the coating thickness increases sufficiently, the guard is not sufficiently effective to permit that condition to be distinguished from a true high-level condition. This is an intrinsic attribute of admittance—responsive systems.

Another aspect of many known systems is that they are two-state systems: their output is a high or low logic signal, a closed or open relay contact, a lamp which is on or off, or some similar bi-level output, which is intended to correspond with and represent the presence or absence of material in the vicinity of the sensor, e.g. high material level or low material level conditions. A coated sensor, which is in fact a range of third conditions, is by design or by default assigned to one of the two available output states. Typically, a coating of sufficiently great thickness and conductance or susceptance will provide the same output state as a full vessel. The system may be designed to "ignore" up to a certain amount of coating, but there is always some coating condition to which it must falsely respond.

The foregoing aspects of the known systems can represent severe drawbacks in certain applications, particularly where coatings can accumulate, i.e. grow in thickness with the passage of time. In such applications, the system may respond properly to material when installed, and even for a time as a coating begins to accumulate. Eventually, however, at some unknown time the system will give a false high-level output when its coating tolerance has been exceeded. Such an application is in monitoring the lavatory waste holding tanks of airplanes. In some airplanes, the output of the waste tank monitoring system is used to lock the lavatory doors to prevent their further use. False high alarms can needlessly eliminate the ability of the passengers to eliminate, to their great discomfort on long flights. Other applications are subject to inconvenience, expense, or hazard upon coating—induced false level signals.

It would be highly desirable for a condition monitoring system to determine the extent of coating present on members in the interior of the vessel, and in particular, on the sensor, in order that the coating could be cleaned prior to building up sufficiently to interfere with level or other measurements desired to be made in the presence of a coating. However, known bi-level output admittance-response systems are incapable of doing so. This is because the admittance presented to the sensor is a function of the material electrical properties as well as the condition of the material in the vicinity of the sensor. Because the material electrical properties may vary widely and in an unknown fashion between applications, over time in a single application, or even from place to place within a vessel, it is not possible in principle to devise an admittance-responsive system which can unambiguously distinguish between a coated sensor and a true high level, covered sensor condition. As used herein, an admittance-responsive system is one which responds to the admittance presented by the monitored material to the sensor electrode.

Systems for monitoring the condition of materials (e.g. material level, proximity, etc.) at a plurality of discrete condition points are also known. These systems generally fall into two categories.

Systems of the first category generally operate by converting a measurable variable, such as capacitance or admittance, which is related to a material condition being studied, such as height, into an analog signal related to the measured variable. The analog signal is then compared to a plurality of discrete signals or converted to a digital signal which is compared with the plurality of discrete values. In one multi-point monitoring system of the first category known to the inventors, radio frequency admittance measurements are converted to an analog signal which is routed to a plurality of current sensing set point relays. A major problem with such systems is that each stage of operation upon the measured variable, such as amplification, conversion, or comparison, has the potential of introducing spurious effects. In combination, these effects may be sufficient to generate a false output at the comparison stage. It would be necessary to use relatively expensive, very high quality circuit components with very narrow operating tolerances to prevent the introduction of spurious effects.

Systems of the second type incorporate a bridge which compares the measured variable corresponding to the material condition being studied with a reference variable. The output of the bridge is thereafter processed to provide a useful signal. The major advantage of this type of system over the first is that the introduction of spurious effects from the processing circuitry has limited impact because the critical step, bridge comparison, occurs before amplification and subsequent signal processing steps. Known multiple set point monitoring systems which incorporate a bridge are typically operated at balance at a single point and off balance for other points. The balance point may or may not be a set point of interest.

A problem in all known multiple set point systems of both categories is that potentially interfering signals may be present either where the material is being measured or where the resulting measurement signal is processed. It may be necessary to guard the measurement signal against these interfering signals to prevent a false reading of the system. It is considerably more difficult to guard a signal which takes on a wide range of values than it is to guard a signal which is only of interest at a single value. This particular difference is so significant that it allows relatively inexpensive, single-point monitoring systems to outperform more expensive, analog monitoring systems in which interfering signals are present. Such signals might arise, for example, by residual coatings of conductive materials on the sensing element in radio frequency admittance-type material level systems.

Single set point bridge systems are desirably balanced near the set point being examined. In single set point guarded systems, the reference potential of the bridge typically provides a low impedance source of voltage which will be the same as the sensing element voltage when the bridge is balanced. This allows the reference potential to be effectively used to provide a guard voltage to a guard electrode shielding the sensing element. Unfortunately, when the bridge is not balanced, the voltage at the sensing electrode departs from the reference potential. This renders a guard electrode coupled with the reference potential less effective.

A number of other single set point, material condition monitoring systems are known which are capable of generating a plurality of sequential reference signals for calibration. For example, commonly assigned U.S. Pat. No. 4,485,673 to Stern discloses a single set point two-wire level measuring system utilizing a pair of admittance sensitive sensors, each including a capacitive balance bridge. A pair of set point calibration systems is provided, each with a multiplicity of capacitances. The capacitances are selectively coupled to each of the two bridge networks provided for set point calibration. The system is thereafter operated with fixed reference capacitances. U.S. Pat. No. 4,555,941 describes a material level detection system incorporating an automatic calibration circuit in which capacitances are automatically switched into an LC or resonant circuit. Both systems are unsuited for multi-set point operation in their present configuration. Each lacks means for changing the reference set point during monitoring operations. Each also lacks a feedback loop which would adapt to changes in the reference set point during monitoring operations.

U.S. Pat. No. 4,063,447 to Mathison discloses a monitoring system having a bridge network in which a reference current source is adjusted automatically to compensate to system drift. It is also unsuited for multi-set point operation in its given configuration.

U.S. Pat. No. 4,383,444 discloses a capacitance level detection system of the first category in which a measurement capacitance is processed and then compared to a reference capacitance. A microprocessor is provided as part of the system for automatic calibration. There is no teaching or suggestion that this system is useful for or capable of multi-set point operation. Being a first category type system, it is also susceptible to spurious effects during measurement and signal processing.

Lastly, adjustable differential set point monitoring systems are known. Such systems have typically been provided for monitoring sumps and the like. A bridge is provided with a material condition responsive sensor for developing a variable, material condition dependent admittance. A primary capacitor provides a reference admittance. When the bridge output switches as a result of low material related admittance from the sensor, which occurs when the materials in the sump falls below a first level, a second capacitor is coupled with the first capacitor to raise the reference admittance. The bridge output will not switch until the material has risen to a second level above the first. The single output signal of such systems is indefinite as to a particular set point as it may be related to either of two reference capacitances.

OBJECTS AND SUMMARY OF THE INVENTION

It is a general object of the invention to provide a material condition monitoring system for automatic, multiple set point operation.

It is a more specific object to provide a condition monitoring system which can reliably respond to the monitored condition despite the accumulation of a coating on the monitoring apparatus.

It is another object of the invention to provide such a system in which the response is substantially independent of the electrical properties of the monitored material, and particularly, over a wide range of material electrical properties.

It is another object of the invention to provide such a system which provides an output containing information relating to the thickness of a coating.

It is another object of the invention to provide such a system in which coating thickness information and information relating to other monitored conditions may be output either separately or combined in a single communication channel.

It is another object of the invention to provide such a system in which the accuracy of monitoring of each condition is unaffected by the monitoring of all other conditions.

It is another object of the invention to provide a system which may be automatically tested by automatically simulating condition corresponding to a covered sensor.

In accordance with the foregoing objects, the system of the present invention includes a material-responsive sensor, a bridge or bridge-like means for comparing the sensor output with a reference, detector means coupled to the sensor and to the reference for generating a bi-level output responsive to the bridge which changes state at a predetermined bridge condition, and means for automatically and repeatedly altering a parameter of the bridge means so as to vary the material conditions under which the predetermined bridge condition occurs. Output means coupled to the detector will usually, but not always, be required to provide output signals having characteristics required or desired to interface the system of the invention with other systems.

In the preferred embodiments, the bridge means is a radio frequency admittance bridge. In the preferred embodiments of the invention, the means for altering a bridge parameter is a controlled variable admittance which is controlled to assume a predetermined sequence of admittances, one admittance corresponding to each material condition set point of interest.

It is yet another object of the invention to provide such a system which outputs a resultant signal which is of interest at the same single value regardless of the number of set points being monitored.

It is yet another object of the invention to provide a multiple set point system automatically providing an effective guard voltage level for a material monitoring sensor.

It is yet another object of the invention to provide such a system employing a bridge in which the bridge is balanced at each of a plurality of points during monitoring operations.

It is yet another object of the invention to provide such a system without introducing instability to the system at any one or more of the multiple set points.

In a first embodiment of the invention, these and other objects are accomplished in a system for monitoring a predetermined condition, such as height, distance, etc., of material which comprises a bridge network, admittance sensing means which develops a variable admittance related to the condition of the material being monitored and which is coupled with one of two arms in the variable side of the bridge network, and a sequential admittance generator automatically generating a regularly repeated sequence of different, predetermined effective admittances during the operation of the system and coupled with a remaining arm of the variable side of the bridge network. When energized in a conventional manner, the bridge network generates a signal indicating the state of imbalance of the bridge for the particular admittance coupled with the bridge.

According to one important aspect of the first embodiment of the invention, the system continuously outputs a multiplicity of bridge state signals, one for each of the predetermined material conditions of interest.

According to another important aspect of the first embodiment of the invention, the sequential admittance generator is formed by a plurality of admittance elements and a means for selectively coupling each of the admittance elements with the bridge. Further according to this aspect of the invention, a control system is provided for sequentially coupling the admittance elements with the bridge. The control means includes a clock and a sequencer responsive to the clock. The sequencer in turn includes an address generator driven by the clock and a decoding means for decoding the address signals generated.

Further according to a first embodiment of the invention, system feedback unique to each particular set point is provided by a monitoring circuit generating a signal indicative of the difference between a material generated admittance and each value of a sequence of reference admittance values, and by the provision of a storage device receiving the monitoring circuit signal and storing a corresponding characteristic of the monitoring circuit signal for each admittance value of the sequence of reference admittance values. In particular, according to a first embodiment of the invention, a control circuit is provided, coupled with the storage means, which causes the generation of a feedback signal passed to the monitoring circuit. The feedback signal has a characteristic based on the corresponding characteristic stored when the particular reference admittance being employed in the monitoring circuit was last previously generated. Further according to this aspect of the invention, the control circuit sees that the corresponding characteristic of the monitoring circuit signal for a particular reference admittance value is again stored before a different reference admittance value is generated. In the described preferred embodiment of the invention, the output signal is bi-level (i.e. may assume one of two possible levels) and a latch is provided for storage of the bi-level value of the monitoring circuit signal for each of the different reference admittances generated. The latch further provides a source for the bi-level feedback signal.

Another important aspect of the first embodiment of the invention is the circuit provided for controlling the generation of sequential reference admittance values in a condition monitoring system. The circuit includes an address generator, generating a series of identifiers each identifying a different one of a plurality of reference admittance values to be generated in a sequence, and a decoder circuit receiving the series of identifiers and controlling a sequential admittance generator which actually generates a plurality of reference admittance values in particular sequence in the monitoring circuit. An important aspect of the invention is that the address generator can also be used to control feedback provided to the monitoring circuit. According to this aspect of the invention, a storage means, such as a latch, is coupled to the monitoring circuit. The storage means stores a characteristic value of the monitoring circuit output signal for each of the different reference admittances generated by the sequential admittance generator. The storage means operates under the control of the address generator.

In accordance with a second embodiment of the invention, the material responsive sensor is coupled to the bridge means so as to provide a voltage responsive to the thickness of material covering the sensor and substantially independent of the material electrical properties. Further according to the second embodiment of the invention, a tri-state system output is automatically generated, one state representing low material level, one state representing high material level, and one state representing coating thickness in excess of a predetermined amount. This latter signal state is useful for indicating that the vessel, including the sensor, should be cleaned to avoid false high level outputs.

These and other aspects of the invention will be apparent from the accompanying figures and following detailed description of the preferred embodiments of the invention.

BRIEF DESCRIPTION OF THE FIGURES

FIG. 4 is a composite diagram illustrating the relative position of FIGS. 4a–4e, a schematic of circuits of FIG. 3.

FIG. 5 is a diagrammatic depiction of an equivalent bridge of the first embodiment.

FIG. 6 depicts diagrammatically variable gain applied by the error amplifier of the first embodiment.

FIGS 8a, 8b, 8c and 8d depict schematically four bridge circuits useful in the present invention

DETAILED DESCRIPTION OF THE INVENTION

Figure 1:
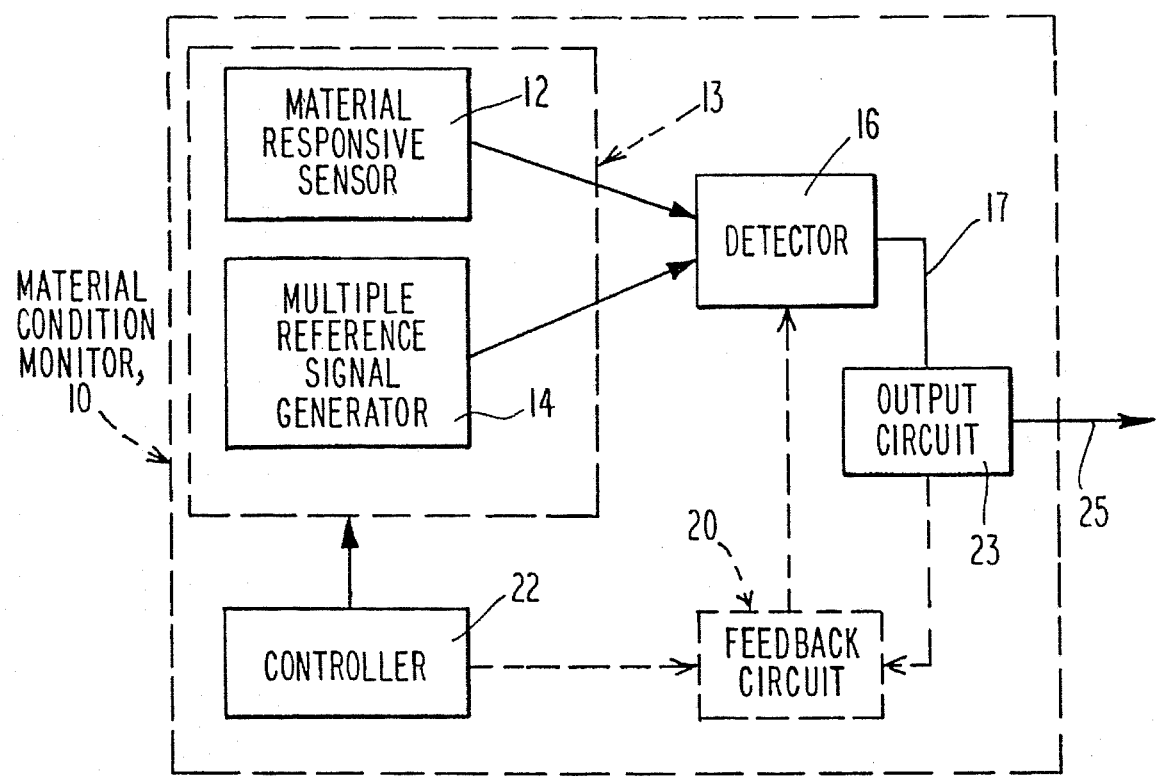
FIG. 1 is a diagrammatic block diagram of the major operating components of the invention.

FIG. 1 is a block diagram illustrating the basic elements of a material condition monitoring system 10 in accordance with the present invention. The system includes bridge means 13 including a reference signal generator 14 and a material responsive sensor 12 for generating a signal responsive to the condition of monitored materials. The outputs of bridge means 13 are coupled to a detector circuit 16 for generating a bi-level output 17 which changes state at a predetermined bridge condition. An output circuit 23 generates an output 25 and is provided to interface, as necessary, the information in processing circuit output 17 with the signal requirements of devices external to monitor 10. A controller 22 is provided to automatically and repeatedly vary a parameter of bridge means 13. In this way, the material conditions corresponding to the predetermined bridge condition, i.e. to which the system 10 will respond, are automatically and repeatedly varied. In one embodiment of the invention, a feedback circuit 20 is coupled to controller 22 and output circuit 23 to apply feedback to processing circuit 16. The feedback provided is varied in conjunction with the bridge parameters. In particular, when a bridge parameter is varied to correspond to a particular material condition, the feedback initially applied is made to correspond with that which was applied the last time that the bridge parameter was varied to correspond to that material condition. In this way, the monitor 10 may respond to each material condition of interest regardless of the occurrence of other material conditions of interest.

The output 25 contains information relating to a plurality of conditions monitored by a single sensor 10. In certain embodiments of the invention, a single output 25 is generated which contains all such information. In other embodiments, output signal 25 may comprise separate outputs relating to monitored conditions or combinations thereof.

Figure 2:
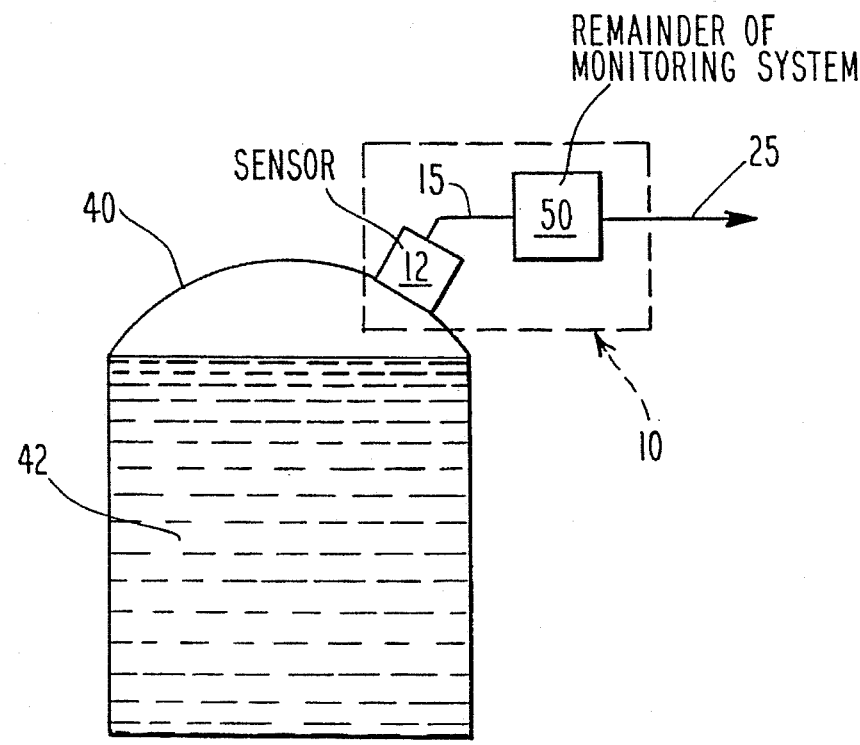
FIG. 2 is a diagrammatic depiction of the environment in which the invention may be used.

FIG. 2 illustrates an environment in which the present invention may be used. Container or vessel 40, with material inlets and outlets not shown, contains a material 42. For a fluid material which is capable of coating surfaces which it contacts, the material conditions to be monitored may be whether or not the vessel is full, i.e., a high level measurement, and whether or not a coating has developed to the extent that it may interfere with the high level measurement. These material conditions are of interest, for instance, in monitoring the lavatory waste holding tanks on aircraft. A large aircraft, such as the Boeing 747, may contain four such tanks serving eleven lavatories. In order to prevent use of a lavatory when its holding tank is full, monitoring systems 10 are provided which include a material-responsive sensor 12 coupled to the remainder 50 of the monitoring system by coupling means 15. The sensor 12 is mounted in the wall of vessel 40 so as to be exposed to materials 42. The system is intended to provide an output 25 when the level of material 42 rises above and covers the sensor 12. Output 25 may be used to take measures to preclude further use of the lavatory, such as locking the door. A plurality of such systems 10 may be disposed in a single vessel.

Prior art systems have operated by monitoring the capacitance between a measuring electrode and the vessel wall. The vessel is typically a radio frequency ground, and may be formed with an inner layer of stainless steel and an outer layer of fiberglass. As has been described, a substantial problem with prior art systems arises from the normal buildup of a coating on the interior surface of the vessel 40, including the sensor 12. The material may be substantially conductive, e.g., 4000 micromhos per centimeter, and a very thin coating may be sufficient to swamp the capacitance measurement and generate a false high level output 25. An increase in the thickness or conductivity of coating which can accumulate before a false high level output occurs may be obtained by interposing a "guard" or "shield" electrode between the measuring electrode and the vessel wall. When driven substantially at the potential of the measuring electrode, such a shield electrode can substantially reduce surface leakage currents. However, even with such a guard electrode, eventually a material coating thickness is reached which results in a false high level output indistinguishable from that caused by a high material level. The present invention is intended to circumvent such problems of the prior art.

Figure 2A:
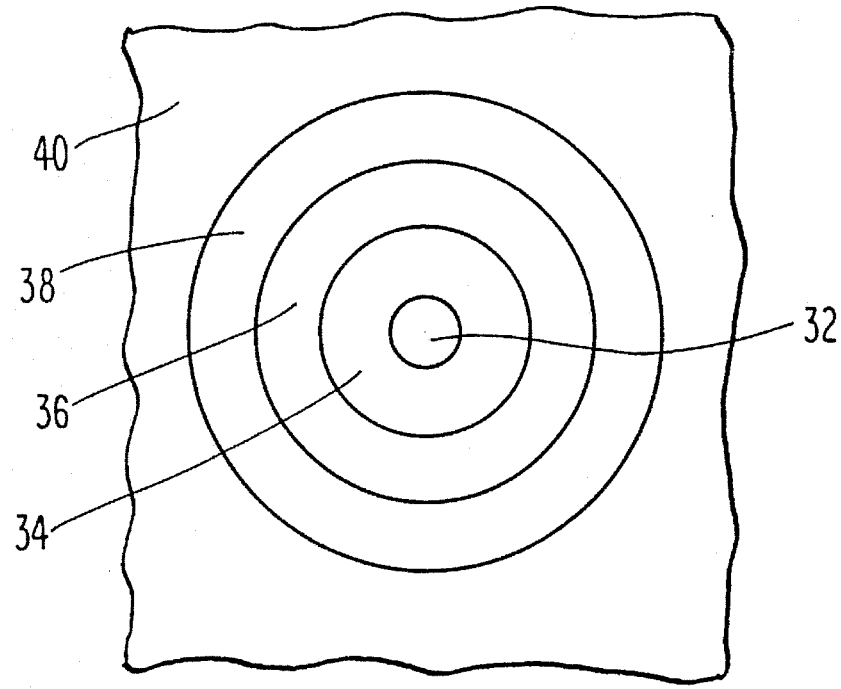
FIG. 2a depicts a preferred material responsive sensor useful in the present invention, as viewed from the interior of the vessel containing material to be monitored.
Figure 2B:
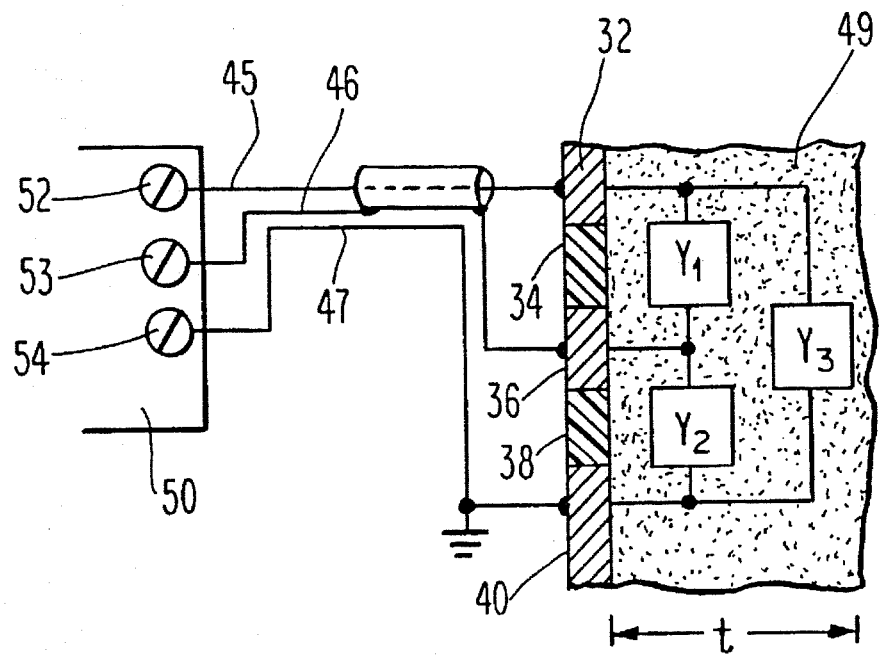
FIG. 2b depicts schematically a cross-section of the sensor of FIG. 2a, including the electrical effects of a coating.

FIGS. 2a and 2b depict a sensor 12 useful in the systems of present invention. FIG. 2a is an elevation of the sensor as viewed from inside vessel 40, i.e., as exposed to material 42. Sensor 12 contains a measuring electrode 32, and a shield electrode 36 interposed between measuring electrode 32 and the vessel wall 40 in all surface paths between them. The electrodes are mutually insulated from each other by electrical insulating means 34 and 38. While as shown the reference potential to which the measurement is made is provided by the vessel wall 40, it will be understood that an additional electrode could be provided in the sensor structure in the event that the vessel wall is nonconductive or otherwise not at radio frequency ground. While the electrodes and insulators are of circular configuration as shown, it will be understood that other configurations may be used. Further, while the sensor is desirably substantially flush with the surface of 40, sensors in which the elements are not planar and protrude into the vessel may also be used.

FIG. 2b shows schematically a partial cross-section of the sensor electrode structure of FIG. 2a, together with electrical connections of the sensor to the remainder of monitoring system 10. The view depicted merely represents the electrical aspects of the sensor, and of an adherent coating 49 of material, and does not depict structural aspects which will be present in a real sensor for mechanical or other purposes. Measuring, shield, and ground electrodes 32, 36, and 40 are coupled to terminals 52, 53, and 54 of the other portions 50 of monitoring system 10 by conductors 45, 46 and 47. Desirably these conductors are short, to minimize impedance, but if any substantial separation of system components is desired, coaxial cable may be used as shown. The sensor is depicted in cross-section in FIG. 2b with a coating 49 of material 42 having a thickness t. When coupled to a bridge circuit of the sort discussed more fully hereinafter, the coating presents effective admittances $Y_1$ between the measuring and shield electrodes, $Y_2$ between the shield and ground electrodes, and $Y_3$ between the measuring and ground electrodes. The effects on measurement of these effective admittances is also discussed more fully hereinafter.

FIGS. 8a, 8b, 8c, and 8d depict various bridge circuits which may be used in the present invention. These bridges are energized by one or more alternating voltage sources. The bridges depicted are adapted to be coupled to three-terminal sensors of the sort shown in FIGS. 2a and 2b, and to provide a material responsive differential output $V_o$ to a detector circuit which is substantially zero at monitored conditions of interest. The monitored material presents effective admittances $Y_1$, $Y_2$, and $Y_3$ to the sensor, as illustrated in FIG. 3b.

The bridge circuit of FIG. 8a includes a pair of voltage sources 502 and 504, generating voltages $V_1$ and $V_2$, respectively, which form a first side of the bridge. The second side of the bridge comprises an admittance element 506 having admittance $Y_a$ coupled to the material-responsive admittances $Y_1$, $Y_2$, and $Y_3$. The bridge is balanced at $V_1 Y_a = V_2 Y_3$. Admittance $Y_1$ does not affect the measurement because it is in parallel with a voltage source; admittance $Y_2$ does not affect the measurement when the bridge is balanced.

Figure 12:
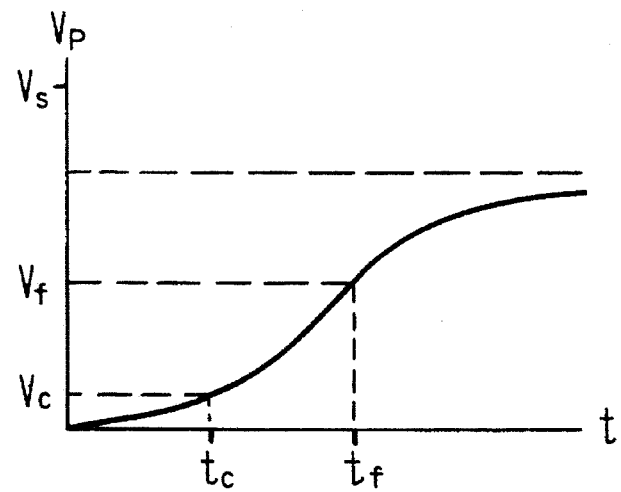
FIG. 12 is a graph illustrating sensor output versus material condition for certain embodiments of the invention.

The bridge circuit of FIG. 8b differs from the circuit of FIG. 8a in that the effective admittance $Y_1$, which is normally a parasitic condition attempted to be ignored, forms an integral part of the measurement. This bridge is balanced, i.e., the output Vo to the processing circuit is zero, when the measuring electrode voltage Vp is different from the shield electrode voltage. This bridge includes a first side comprising alternating sources 508 and 510, which generate voltages $V_1$ and $V_2$. It further includes admittance elements 512 and 514 having admittances Yb and Yc. Prior to further description of the operation of this bridge, reference should be made to the coating admittance model of FIG. 2b and the graph of FIG. 12 illustrating the measuring electrode voltage Vp as a function of coating thickness t for the model of FIG. 3b.

In a bridge circuit according to FIG. 8b it is preferred that the monitoring circuit source impedance coupled to the shield and ground electrodes is sufficiently low that it is not substantially loaded by the expected material admittance presented between these electrodes. This can be accomplished by judicious choice of electrode geometry, using a low impedance source, and minimizing connection impedance. Further, it is preferred that the material admittance presented to the measuring electrode under expected material conditions of interest be sufficiently high that it is not loaded by the monitoring circuit input admittance coupled to the measuring electrode. Under these conditions, the shield to ground admittance $Y_2$ has negligible effect on the measurement. The shield to ground voltage energizes the material electrically coupled to the material responsive sensor 12 so as to apply a voltage to measuring electrode 32 which is a function of the source voltage $V_s$ and the admittances $Y_1$ and $Y_3$. In particular, with respect to shield voltage $V_s$, the measuring electrode voltage $Vp = V_s Y_3/(Y_1+Y_3)$. Under the preferred conditions set forth above, $V_s$ is a constant. $Y_1$ and $Y_3$ vary with material thickness t so as to cause Vp to vary in the manner illustrated in FIG. 12. For coatings which are very thin with respect to the width of the shield electrode, the coating over the shield electrode is driven at substantially $V_s$, and $Y_3$ is small relative $Y_1$. Accordingly, the measuring electrode voltage Vp is substantially equal to the shield voltage $V_s$. As coating thickness t increases, the outer portions of the coating become progressively less effectively coupled to the shield electrode, with the result that $Y_3$ increases. While $Y_1$ also increases with thickness, it does so at a lesser rate than $Y_3$. Accordingly, as thickness t increases, Vp departs from $V_s$. When t becomes sufficiently large, additional increments of coating thickness have little effect on the admittances presented to the electrodes and Vp approaches a limiting value less than $V_s$. These characteristics are illustrated in FIG. 12.

An important feature of the bridge of FIG. 8b operating under the preferred conditions set forth above is that the measuring electrode voltage Vp, while responsive to material thickness t, is dependent on admittance ratios but independent of the absolute values of the admittances. Because the admittance ratios are dependent on sensor and coating geometry but independent of the conductance and susceptance of the material, the voltage applied to the measuring electrode is substantially independent of the material electrical characteristics and, for a given sensor geometry, varies only with coating thickness.

Returning to FIG. 8b, it is seen that material will apply, under the coated or full conditions of interest, a voltage Vp to Yc in one arm of the bridge. The bridge is balanced when Vo=0, which requires that $V_3$ Yb=Vp Yc.

FIG. 8c shows a bridge which has properties similar to that of FIG. 8b, but which is energized by a single source 516 which applies alternating voltage $V_s$ between the shield and ground electrodes. It further comprises admittances elements 518 and 520 having admittances Yd and Ye in a first side of the bridge, and admittance elements 522 and 544 having admittance Yf and Yg on a second side of the bridge. Yf and Yg form a divider across $V_s$ applying a fraction thereof to one input of the detector circuit. Yd and Ye form a divider applying, with respect to $V_s$, a fraction of Vp to the processing circuit. The latter, and thus the output Vo, is a function of Vp and therefore of the material thickness. In the simplest case, Yd=0 and Ye is effectively a short circuit, yielding the bridge shown in FIG. 8d.

It will be understood that there are numerous modifications to the above bridges which are equivalent to them. For instance, various voltage sources may be superposed to yield equivalents of the bridges shown. Also, voltage sources operating through admittances, such as 502 and 506, may be replaced with Thevenin equivalent current sources.

In accordance with the invention, means are provided for automatically and repeatedly varying a bridge parameter. The parameter which is varied is preferably one of the admittances in the bridge, since implementation is often easier in this case. The varied admittance is also preferably a susceptance, although conductance or a combination of them may also be used. It will be understood, however, that the other bridge elements such as a voltage source or current source may be varied and yield equivalent results. For instance, in FIG. 8b, voltage source 508 may comprise a transformer winding having a plurality of taps, and a controller may automatically and repeatedly couple admittance 512 to the taps in a predetermined sequence.

The means for automatically and repeatedly varying a bridge parameter is preferably implemented using controlled switch means, whether electronic or electromechanical. When the varied bridge parameter is an admittance, such switch means couples different admittances or combinations thereof into the bridge. One or more of such admittances may be adjustable, so that the bridge parameters which are automatically and repeatedly selected may be adjusted to correspond with material conditions of interest and sensor characteristics in different applications. However, the controlled means for varying a bridge parameter may also comprise a continuously controllable admittance, such as a diode coupled as a voltage variable capacitance.

When a bridge parameter is automatically and repeatedly varied among a plurality of values, the monitoring system may respond at a plurality of measuring electrode voltages Vp which are of interest. For instance, referring to FIG. 12, the system may first respond to a voltage Vc corresponding to a coating thickness tc which is deemed thick enough that cleaning action should be taken to avoid possible false high level signals. The system may respond to a second voltage $V_f$ corresponding to a thickness $t_f$ sufficiently great that the sensor may be deemed covered, i.e., corresponding to a full vessel. Moreover, a plurality of voltage levels may be monitored corresponding to different coating thicknesses of interest. For a sufficiently large number of thicknesses monitored, the system can approximate a continuous thickness monitoring system, and a continuous system may be provided by continuously varying a bridge parameter.

Figure 3:
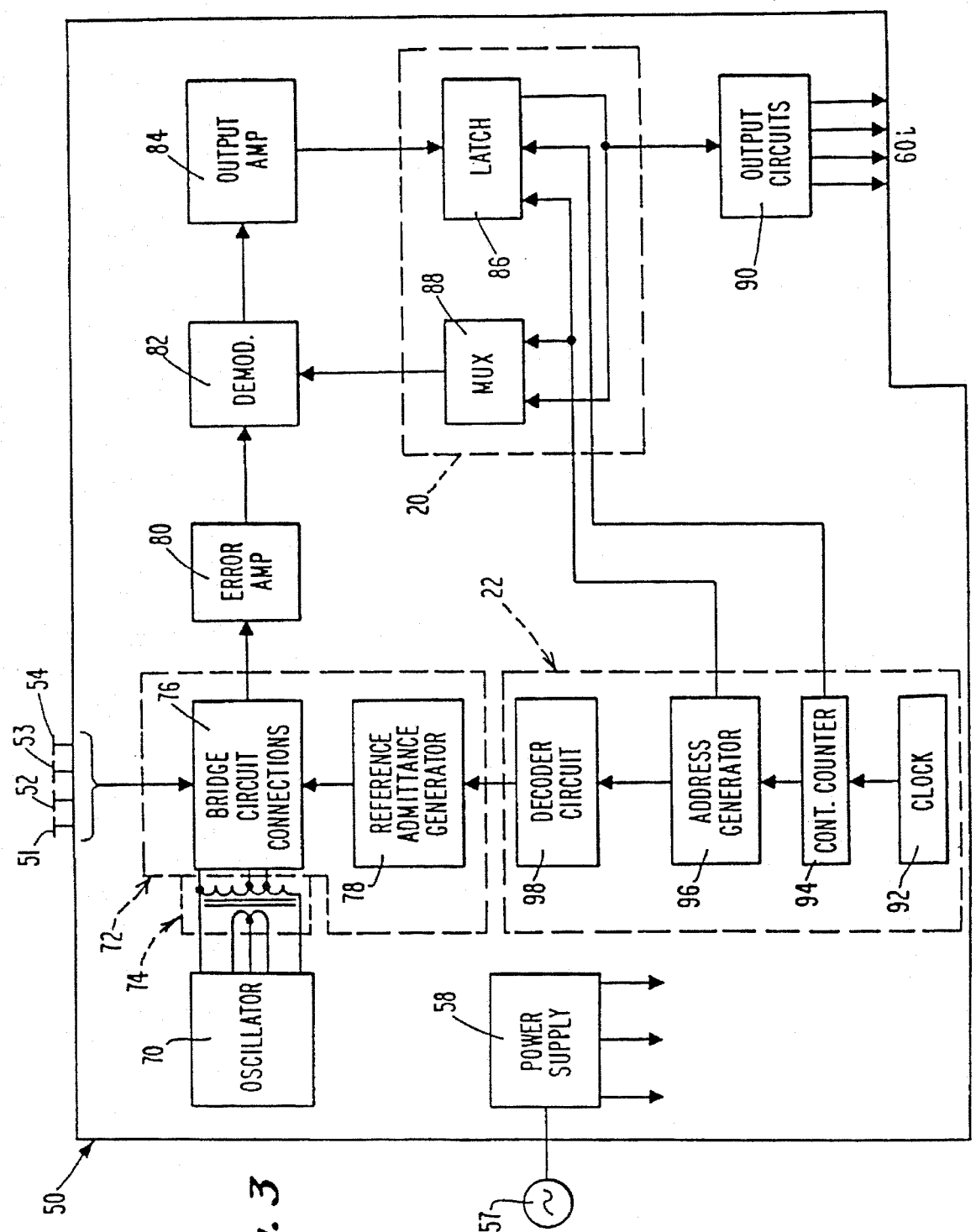
FIG. 3 is a more detailed block diagram identifying the subsystems of a first embodiment of the invention.

Referring now to FIG. 3, there is depicted in block diagram form the major circuit components of the circuitry 50 coupled to the sensor in the first embodiment of the invention. An admittance bridge 72 is coupled with an oscillator 70. The bridge includes a ratio-arm transformer 74 forming the fixed side of the bridge and providing a reference potential. The bridge 72 also includes a reference admittance generator 78 and circuitry 76 coupling the generator 78 with the external connections 52–54 from the sensor 12. The output of the bridge 72 is passed to a variable gain error amplifier 80. Output of the amplifier 80 is passed to a demodulator 82. The demodulator 82 is usually configured to essentially ignore the conductive component of the bridge output and to respond to the susceptive component of the bridge output. This, in turn, is related to the susceptive component of the reference and sensor admittances. The demodulator 82 outputs an analog voltage level signal passed to an output amp 84. The amp 84 generates a bi-level (binary) signal indicating the direction of bridge imbalance. The bi-level signal from the output amp 84 is passed to a feedback circuit 20 which includes in the preferred embodiment, a latch 86 provided as a combination storage means and signal generator and a multiplexer 88 provided as a feedback signal selector. The latch 86 outputs a separate signal for each admittance value generated by the reference admittance generator. These signals are carried to an equal number of output circuits 90. Each output circuit includes one of the sets 60a–60d of controls, indicator and output connections and is associated with a single admittance set point value. The multiplexer 88 selects in sequence one of the several signals outputted from the latch 86 for feedback to the demodulator 82. Both the reference admittance generator 78 and the feedback circuit 20 are controlled by the controller 22. The controller 22 includes a clock 92 driving a continuous counter 94 which controls both an address generator 96 and the latch 86. The address generator 96 is coupled with a decoder circuit 98 associated with the bridge 72. The decoder 98 controls the operation of the reference admittance generator 78. The address generator 96 further controls the operation of the latch 86 and multiplexer 88. A power supply circuit 58 is provided coupled with the 120 VAC, 60 cycle, current source 57. The power supply circuit 58 maintains a system ground and three different positive supply voltage levels, approximately +12, +8 and B+, for energizing the various circuits.

The system of FIG. 3 operates generally in the following manner. The oscillator 70 energizes the bridge circuit 72 including the ratio-arm transformer 74; this transformer may form a part of the oscillator 70 as well. The admittance generated by the condition of the material being monitored through the sensor 12 is coupled into one arm of the variable side of the bridge through the connectors 52 through 54. The reference admittance generator 78 is coupled with the remaining arm of the variable side of the bridge. The ratio-arm transformer 74 provides a fixed side of the bridge. The generator 78 generates a plurality of stable admittance values in a predetermined sequence. This sequence is continually repeated during system monitoring operations. Each different reference admittance value corresponds to a material condition set point. As will be described in detail with respect to subsequent figures, the generator 78 of the preferred embodiment is equipped with a plurality of adjustable capacitors. Each capacitor is switched into and out of the variable side of the bridge network under the control of the controller 22 which accomplishes this cyclically in a repeated, predetermined sequence. Generally speaking, the bridge will be balanced when the ratio of the sensor admittance to the reference admittance equals the ratio of the ratio arm transformer. The error amplifier 80 and the demodulator 82 are responsive to the degree, phase, and direction of bridge imbalance. The output of the demodulator 82 is an analog voltage level signal indicating direction, phase, and degree of imbalance. The output amplifier is provided to convert the analog signal into a bi-level (i.e., binary or logic level) signal indicative of the condition of the bridge, in particular, the direction of imbalance.

An important aspect of the first embodiment of the invention is the mechanism for providing independent, positive feedback for each reference admittance value, i.e., providing hysteresis. The latch 86 outputs a separate output signal for each reference admittance value indicating the state of the bridge imbalance for that particular admittance value. The signal for each reference admittance value is selected by the feedback multiplexer and fed back to the demodulator. This is accomplished by first coupling a new reference admittance value into the variable side of the bridge 72, and then, after the bridge 72 has had a chance to stabilize, writing the bi-level value of the output amp signal into the latch. That bi-level value is thereafter used to generate the output signal for that particular reference admittance value and to control the feedback to the demodulator until a new bi-level value is written into the latch after that particular reference admittance value is again coupled into the bridge circuit. If the feedback signals were to be derived directly from the demodulator, the demodulator would then be responsive to the feedback signal due to a different reference admittance value when the new reference admittance value is coupled into the bridge circuit 72. This could produce an interaction between the set points. In a case where two or more sequential set points were close in value, this could cause the output signals to switch en mass, rather than individually. Thus, the value of the output signals pass from the latch 86 to the output circuits 90 for each of the set points being monitored, corresponding to the value of the output amp output signal written into the latch the last time that reference admittance value was coupled into the bridge circuit. Thus, each reference admittance controls the system during the period of time it is actively switched into the bridge network and is independent of the other reference admittances, their associated bridge condition and output signal states. This produces the effect of having a plurality of independent controllers, all responsive to a single sensor.

FIG. 4 is a composite diagram showing the relative position of each of the schematic FIGS. 4a–4e which depict in detail the circuits of FIG. 3.

Figure 4A:
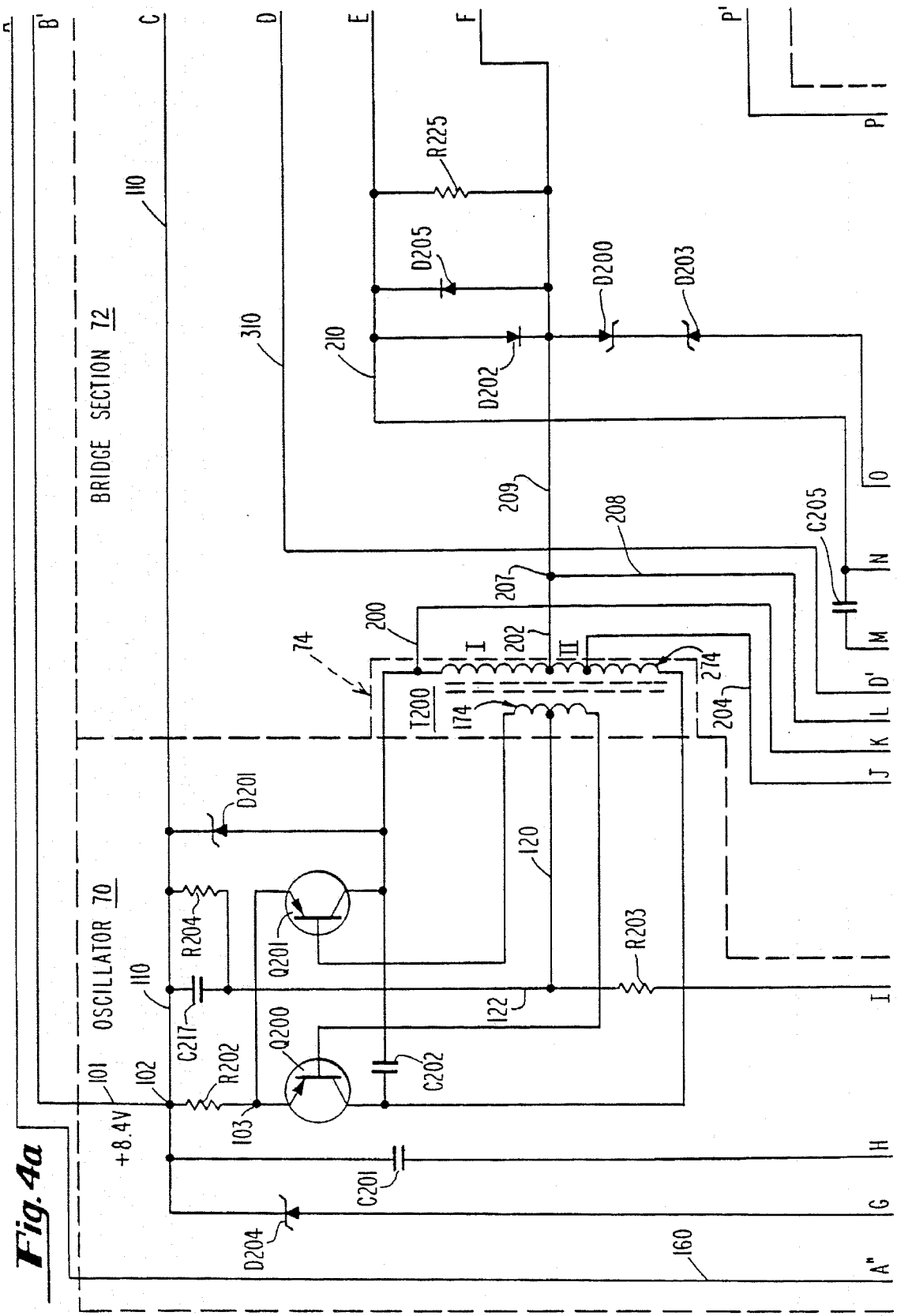
FIG. 4a is a schematic diagram of the bridge network connections with the oscillator of the first embodiment.

Referring first to FIG. 4a, there is depicted on the left half of the figure, the circuit elements of a Class C power oscillator 70 and its connections with the bridge circuit 72. An 8.4 volt supply is provided to the oscillator on line 101 and is filtered by C201 and overvoltage protected by D 204. The inductance of winding 274 of transformer 74 forms a resonant circuit with capacitor C202 which is alternately energized by current from the collectors of transistors Q200 and Q201, whose emitters are coupled to the 8.4 volt supply by current limiting resistor R202. The bases of transistors Q200 and Q201 are provided with D.C. bias from a divider network comprising R203, R204 and C217 through winding 174, and A.C. positive feedback from winding 174. D201 limits the voltage excursion with respect to the 8.4 volt supply.

Figure 4B:
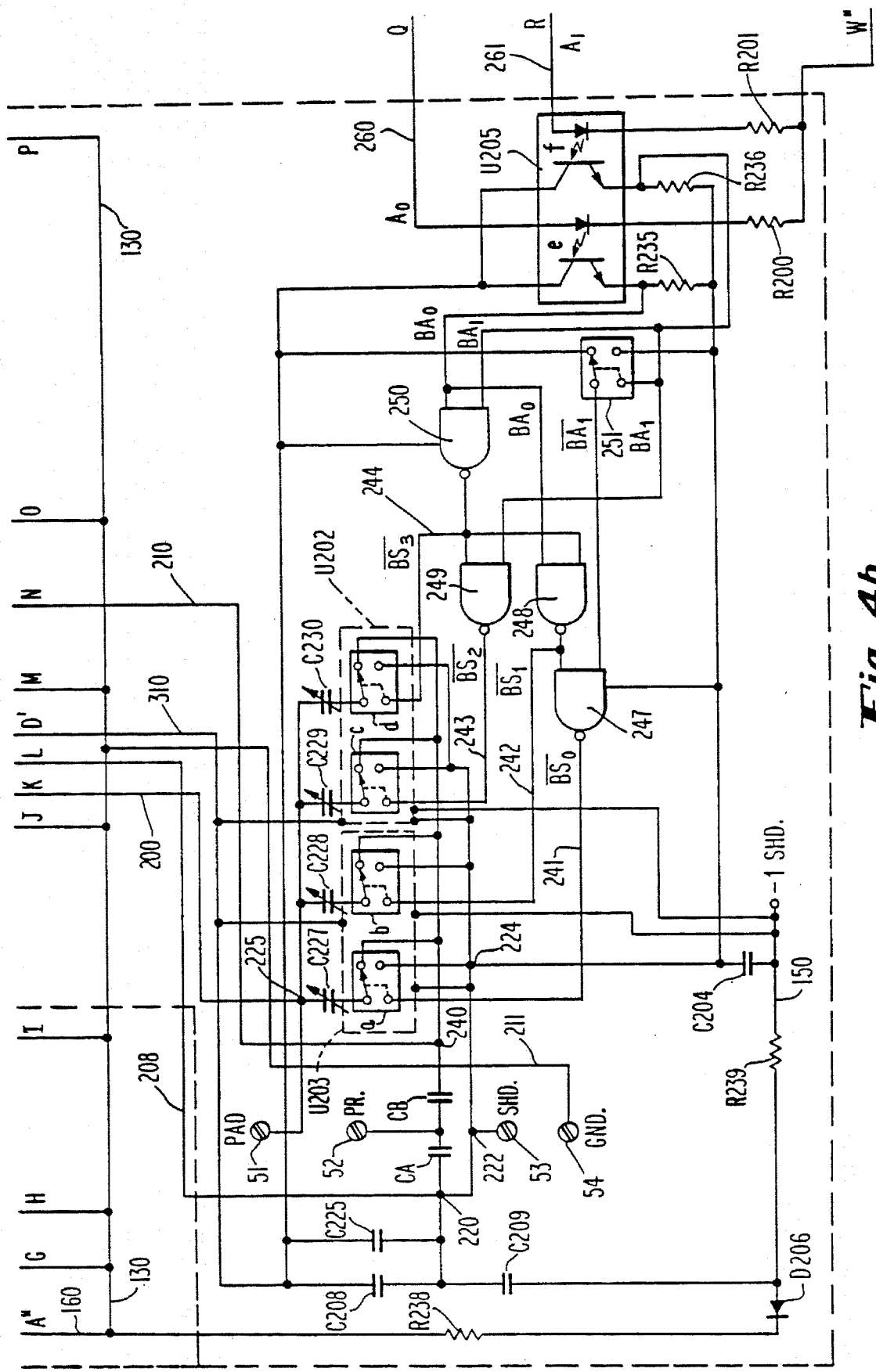
FIG. 4b is a schematic of the remainder of the bridge circuit, including the reference admittance generator and decoder logic of the first embodiment.

The right half of FIGS. 4a indicates the connection of the bridge circuit 72 including transformer 74 with the error amp 80. A line 200 extends from the "high" end of the winding 274. A line 202 extends from a central tap in the winding 274. A third line 204 extends from a tap between the central tap and low end of the secondary winding 274 as will be discussed in more detail with respect to FIG. 5. The lines supply bridge potential to other portions of the circuitry which will be later discussed. The portion I of the winding between the central tap 202 and line 200 from the upper end forms one arm of the fixed side of the bridge network while the portion II of the winding 274 between the central tap line 202 and the lower tap line 204 forms a second arm of the fixed side of the bridge. Unequal arms are provided by the winding 274 for scaling. In the described embodiment, the ratio of the high arm I (i.e., between 200 and 202) and the low arm II (i.e., between 202 and 204) is 10/3. Line 202 provides a low impedance source of voltage which will be substantially the same as the voltage at the probe assembly measuring electrode 32 when the bridge is balanced. This allows line 202 to provide a source of voltage for the shield member 36. The line 202 branches at node 207 into a line 208. As seen in FIG. 4b, line 208 from line 202 is carried to the connector 53 coupling the control box with the shield member 36. A second branch 209 from 202 is passed to the error amp 80 and is used there in a manner to be later described. Because the first embodiment of the invention operates by balancing the bridge for each different set point considered, voltage supplied to the guard or shield member 36 by the bridge center along line 208 is always equal to the voltage level of the measuring electrode 32 when the bridge is balanced. Line 210 is an output line from the balance bridge network and carries the bridge output to the error amp 80. The output line 210 is coupled with the ground return line 130 (FIG. 4b) through a capacitor C205, which is provided for insuring that the bridge will always balance without additional sensor admittance. C205 is coupled in the bridge in the same arm with the admittance of sensor 12 and allows the bridge to be balanced even if the sensor is not connected into the bridge or if no measurable impedance is provided by the sensor. This allows the system to be adjusted down to a zero capacitance and assures that the instrument is responsive down to a zero capacitance measurement. The output line 210 is also connected with the central tap output branch line 209 from the bridge center through a first diode D202, a second oppositely directed D205 and a load resistor R225. Diodes D202 and D205 are provided for static protection. The center tap branch line 209 is also connected with effective ground line 130 by a pair of zener diodes D200 and D203 coupled in series, head-to-head. These diodes are also provided for static protection and intrinsic safety and limit the voltage between shield and ground. A line 310 feeds from the error amplifier 80 and supplies power at between about +7.5 and 8 volts with respect to the shield voltage to the decoder circuit 98 in a manner to be described in further detail with respect to FIG. 4b.

Referring now to FIG. 4b, there is shown the remaining circuit components for the bridge connections to circuit elements, including the sensor 12 developing the material condition responsive admittance 33 and the reference admittance generator 78, and the decoder circuit 98. Line 200 from the "high" side of the secondary winding 274 is carried to a junction 225. From there, one parallel line extends to external connector 51 marked "PAD". Adjustable capacitors C227, C228, C229 and C230 are also coupled to pad potential at junction 225. In series with each of the capacitors C227 through C230 is a single pole, double throw switch a–d. Pairs of switches a–b and c–d are provided by two CMOS two-input multiplexers, U202 and U203, both type CD4053. The variable capacitances C227 through C230 and their connected switches a–d provided by U202 and U203 constitute the reference admittance generator 78 of FIG. 3. Each switch a–d has one output connected in parallel to a junction 240, and thus to the variable bridge output, and a second output connected in parallel at a junction 224, and thus to the fixed bridge output, i.e., shield potential. Each switch a–d is individually controlled by a line 241, 242, 243 and 244, respectively, extending from AND gates 247–250 forming part of the decoder circuit 98. Shield potential line 208 passes through a junction 220 to a junction 222 coupled with external connector 53 (marked "SHD.") and with junction 224 from the switch outputs.

As has been described, a fixed side of the bridge is formed by winding 274, the upper and lower portions I and II forming a voltage divider. The capacitances C227–C230 and the connected switches a–d of the reference admittance generator 78 form one arm of the variable side of the bridge. The other or "measurement" arm of the variable side of bridge contains the admittance 33 of the sensor 12. As shown in FIG. 4a, line 204 is coupled with return line 130. As shown in FIG. 4b, a line 211 also couples the sensor ground connection 54 with the return line 130. Connections of the sensor 12 with the external connectors 52 and 54, marked "PR." and "GND", respectively, couple the material generated admittance 33 of the sensor 12 into the bridge. In many measuring situations, it is desirable to use a sensor producing more admittance than may be balanced by desirable ratios of the ratio-arm transformer 74 and maximum values of the reference capacitances C227–C230 employed (less the capacitance of capacitor C205). For that reason, a capacitive current divider comprising capacitors $C_B$ and $C_A$ coupled back-to-back between the fixed and variable bridge outputs at junctions 220 and 240, respectively, is provided. Current drawn by the sensor 12 (i.e., the measured admittance Y) is divided between CA and CB. Only CB/CA+CB times the current drawn by the sensor 12 is measured. Ratios from 1/1 to 1/650 are commonly used. For a 1/1 ratio, CB is of very high admittance, i.e., a short circuit. For offsetting the adjustment range of capacitors C227–C230 by a fixed amount, a so-called pad capacitor 55 can be coupled across external connections 51 and 52. The pad capacitor raises the effective reference admittance. This provides a convenient means for shifting the set point ranges allowing the device to be used with a wide variety of material electrical properties and sensors having a wide variety of admittance response to material condition over the range of material conditions which may be of interest.

Operation of the bridge 72 is depicted in FIG. 5. Winding 274 of ratio-arm transformer 74 provides bridge reference potentials on lines 200, 202, and 204, hereinafter sometimes called "pad", "shield", and "ground" respectively, to the remaining circuitry, and through terminals 51, 53 and 54 respectively, to the sensor 12. The reference admittance generator 78 produces an effective admittance 79 (YR) indicated diagrammatically in phantom, under control of lines 241–244 from the decoder 98. Capacitors CB and CA form a capacitive current divider, attenuating the current through the admittance 33 (Y) produced by sensor 12 in the ratio CB/(CA+CB), and thus coupling an apparent admittance Y*CB(CA+CB), into node 240, where it, plus the admittance of C205 (Y205) must be balanced by YR multiplied by the turns ratio N1/N2 of portions I and II (from "pad" to "shield" and from "shield" to "ground" respectively) of winding 274. The balance condition of the bridge is this:

$$Ni*YR=N2(Y205+Y(CB/(CA+B)))$$

or $$Y=(YR(N1/N2)-Y205)\ (CA+CB)/CB.$$

Referring again to FIG. 4b, it is noted that the second contact of each of the switches a–d is coupled to shield potential at junction 224. Therefore, when each capacitor C227–C230 is not connected in the reference balance arm of the variable side of the bridge, it is connected in parallel with winding I of transformer 74, where it has negligible effect. This prevents the undesirable effect which would occur if single-pole single-throw switches were used, wherein an unpredictable variable admittance across the open switch contacts results in unpredictable variable leakage currents into the bridge output at 240.

Each of the switches a–d is controlled by the decoder circuit 98. The decoder circuit is provided by NAND gates 247–250, a switch 251 and a pair of opto-couplers e and f provided on an integrated circuit U205, a type ILD-506. The decoder circuit 98 is coupled with the address generator 96 through lines 260 and 261 carrying bi-level address signals $A_0$ and $A_1$. Each line 260 and 261 feeds into a separate one of opto-couplers e and f, respectively, contained on the single integrated circuit U205. Transistor conduction in each coupler e and f is caused by high level signals on the lines 260 and 261 through associated LED's coupled into each line 260 and 261. The power line 310 extending from the error amplifier circuit 80 is coupled to the transistor collectors in each coupler e and f. The output of each coupler e and f is a bi-level signal $BA_0$ and $BA_1$, respectively, following the levels of the signals $A_0$ and $A_1$ passed on lines 260 and 261, respectively. Signals $BA_0$ and $BA_1$ are fed into a logic network formed by the single pole, double throw switch 251 (used as an inverter), and the four NAND gates 247–250. Each gate 247–250 is coupled by a line 241–244, respectively, with the switch control node of one of the reference generator switches a–d, respectively. In this way, address signals $BA_0$ and $BA_1$ identifying each of the four switches a–d, are decoded and used to control the operation of those switches. Although the circuit could be arranged otherwise for certain purposes and/or desirability, as shown, the decoder circuit controls the switches a–d such that only one of the capacitors C227–C230 is selected and coupled into the reference arm of the variable side of the bridge at any given time. The emitters of the transistors in the opto-couplers e and f are also coupled through load resistors R235 and R236 to shield potential, which serves as a return line. The return line 150 is maintained at approximately 1 volt DC below shield to provide a negative bias for the switches a–d. This is provided by half-wave rectification of the "GND" voltage on line 130 by diode D206 and storage capacitor C209 with R238 to limit the peak current through D206. Filtering is provided by R239 and C204. Power line 310 provides between about 7.5 VDC and 8 VDC with respect to shield, and is locally filtered by C208 and C225.

Figure 4C:
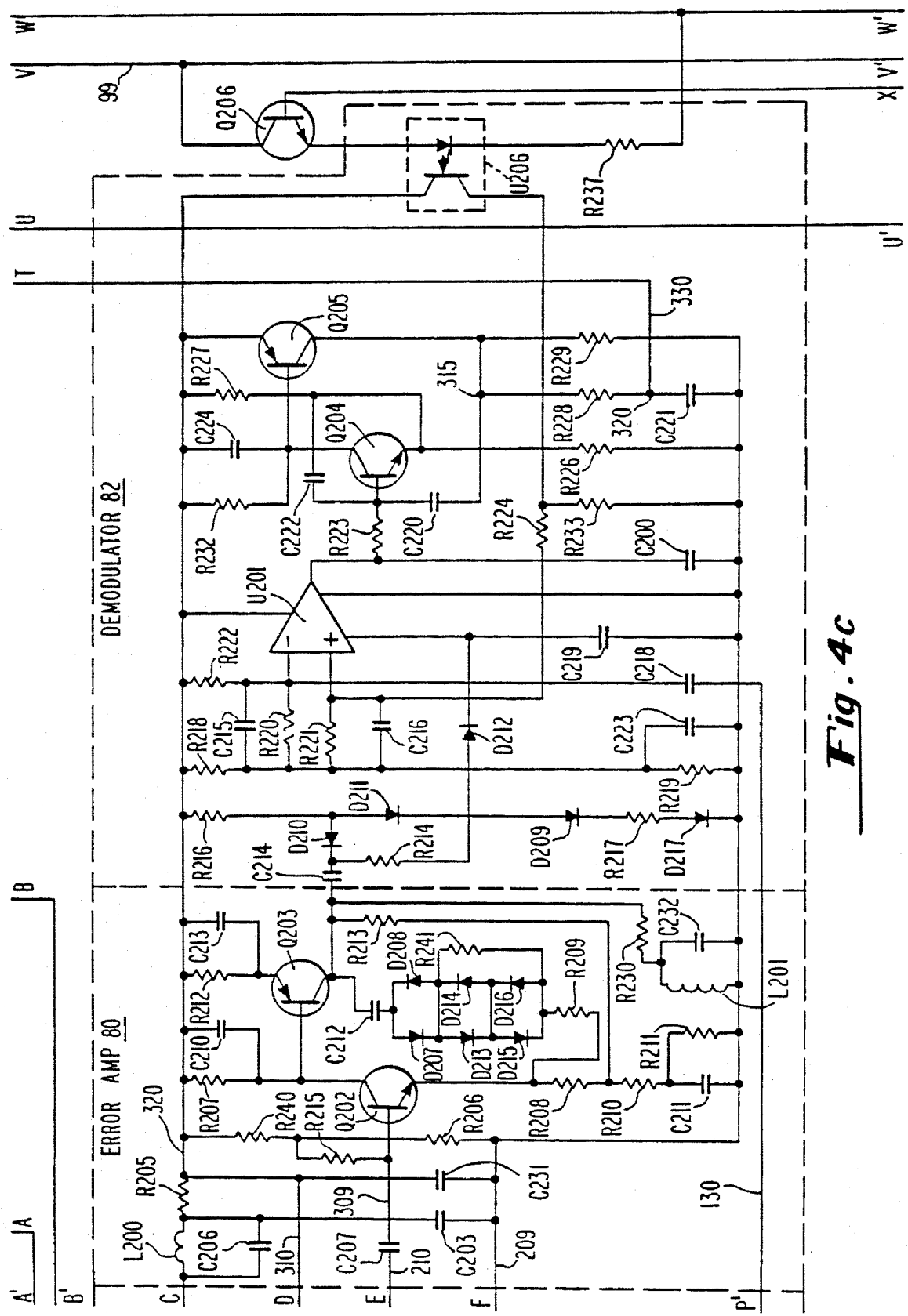
FIG. 4c is a schematic of the error amplifier and demodulator of the first embodiment.

FIG. 4c depicts schematically the components of the error amplifier 80 and the demodulator 82. These form a detector providing a bi-level output which changes state at a predetermined bridge condition, namely balance. Referring first to the error amplifier on the left side of the figure, line 110 brings the approximately 8.4 volt of direct current from the power supply to a parallel resonant bandstop filter formed by L200 and C206, which couples the 8.4 VDC while preventing a large AC current from flowing through C203 into the shield. C203 provides a low impedance path from the output of L200–C206 to shield, filtering the DC with respect to shield until it is close to the AC potential of shield. R205 and C231 provide additional filtering, producing a voltage on line 310 which is between 7.5 VDC and 8 VDC positive with respect to shield, but at substantially the same AC voltage as shield. Line 310 provides a power supply to the bridge section as was previously discussed. It also provides power to the error amplifier 80 through line 320, and the demodulator 82, and optical isolator U206, type 4N25, associated with the demodulator for feedback from the feedback circuit 20 (See FIG.. 3). The bridge output signal from node 240 is carried to the error amp on line 210 and through blocking capacitor 207 into the base of a transistor Q202. The base of transistor Q202 is also coupled through a resistor R215 to the center of a voltage divider network formed by resistors R240 and R206 in series between power supply line 310 and shield line 209. The network R240, R215 and R206 bias transistor Q202 in its active region. The collector of Q202 is coupled with the power line 310 through resistor R207 and capacitor C210 in parallel. The emitter of Q202 is coupled with the shield line 209 through resistors R208 and R210 in series with a bypass capacitor C211 and resistor R211 in parallel. A second transistor Q203 is controlled by the first transistor Q202. The base of Q203 is coupled with the junction of R207 and C210 and the collector of Q202. C210 greatly attenuates frequencies higher than the signal frequency in order to prevent parasitic oscillation. The emitter of Q203 is also coupled with the power supply line 310 through parallel connected emitter bypass capacitor 213 and resistor R212. The collector of Q203 provides an output to demodulator 82 through capacitor C214, and feedback to the emitter of Q202 through the voltage divider formed by R213 and R210, and through resistor R208. Additional feedback from Q203 to Q202 is provided by a multistage diode-switched feedback network comprising C212, D207, D208, R241, D213, D214, D215, D216, R209 and R208. A DC return for the collector current of Q203 is provided by R230, L201, and C232. L201 and C232 are parallel resonant near the signal frequency, allowing the amplifier to have a high load impedance and thus, a high gain. They provide a low impedance load outside the frequency range of interest, thus reducing the gain of the amplifier for signals outside that range. L201 also enables the output to swing below the negative supply rail, thus widening the dynamic range of the amplifier.

The error amplifier 80 provides amplification over a wide dynamic range of input while compressing the dynamic range of its output, so as to greatly simplify the design of the demodulator 82. The multistage diode-switched feedback network of FIG. 4c provides three levels of feedback to the emitter of Q202, and thus the three levels of amplification depicted diagrammatically in FIG. 6. For very low levels of bridge network output (±0.5 millivolt or 1 millivolt or less peak-to-peak), none of the diodes conduct and gain is set at 1000 by the ratio of resistors R213 and R210. Near bridge balance, an approximately 1/4 millivolt peak-to-peak change in the bridge output voltage level is required to actuate the unit. For bridge output signal levels between 1.0 and 11.3 millivolts peak-to-peak, diodes D207 and D208 conduct. This adds the feedback developed by resistors R241 and R209 across R208 and R210 to that developed by R213 across R210. The extra resistors reduce the incremental gain from 1000 to 195. For bridge output signal levels in excess of 11.3 millivolts peak-to-peak, diodes D213–216 also conduct, bypassing R241 and further reducing the incremental gain to 99. With the maximum possible input signal (about 52.6 millivolt peak-to-peak), the output level is 7.08 volts peak-to-peak, for an effective overall gain of 135. The dynamic gain reduction provided by the diode network in the error amplifier preserves both amplitude and phase information, allowing the system to resolve susceptance changes as small as 300 microsiemens in the presence of conductive signals as large as 14000 microsiemens. This is equivalent to detecting a 450 pf. capacitor in the presence of a 70 ohm resistor.

An amplifier U201, type CA3080, is provided for demodulation of the susceptive component from the bridge output signal. The gain input (pin 5) of the amplifier U201 is coupled with the capacitor C214 through resistor R214 and diode D212. C214 is a DC blocking capacitor for passing only the AC portion of the error amp output. The line between the output of D212 and the gain input of amplifier U201 is also coupled through capacitor C219 with the shield line 209. A voltage divider network is provided by resistor R216, diodes D211 and D209, resistor R217 and diode D217 series connected between the power supply line 310 and the shield line 209. The diode D210, resistor R216 and input resistor R214 and diode D212, form a bias chain steering current from the output of the voltage divider to the gain input of amplifier U201. An AC reference signal, substantially in phase with the shield-to-ground voltage, is generated between the inverting and non-inverting inputs of the amplifier U201 with a network including resistors R218–R222 and capacitors C215, C216, C218 and C223. C218 and C215 are primarily responsible for introducing the AC component from bridge input. C223 smooths the voltage taken from between R218 and R219. When the reference AC signal generated across the inverting and non-inverting inputs of U201 is in phase with the bridge output signal passed through capacitor C214, the output current of U201 will contain a DC component proportional to the product of the reference signal generated across the inverting and non-inverting inputs multiplied by the in-phase component of the gain-control current (due to the bridge output signal). When the phasing of the bridge output signal is sufficiently different from that of the reference signal the in-phase component is small, and the resulting DC, is correspondingly diminished. In this way, only the susceptive components of the bridge output, which are in phase with the reference signal, cause a net DC output. By appropriate choice of component values, the demodulator may be made to respond also to the conductive component of the bridge output. This may be useful in enabling the apparatus to compensate for admittances interfering with measurement of desired material conditions, e.g. as described in U.S. Pat. No. 3,746,975 to Maltby.

The DC component of the output of amp U201 is filtered by C200 and amplified by transistors Q204 and Q205 and associated resistors R223, R232, R226, R227 and R229 and capacitors C220, C222 and C224. The amplifier acts as a switch pulling junction 315 high or low. The high impedance output of amplifier U201 is coupled to the base of transistor Q204 through resistor R223. R223 is provided to additionally filter the output of amp U201 in conjunction with C222. Resistor R232 and capacitor C224 are coupled in parallel between the power supply line 310 and the collector of Q204. The output of R232 and C224 is also coupled to the base of a second transistor Q205. A resistor R227 is connected from the power line 310 to the emitter of Q204 and through a capacitor C222 to the output of resistor R223. Load resistors R226 and R229 return the current through Q204 and Q205, respectively, to shield line 209. The voltage at junction 315 is fed back to the base of transistor Q204 through capacitor C220, and is outputted through resistor R228 to capacitor C221. A voltage output of the demodulator is carried on line 330 to the output amp 84. R228 and C221 prevent any AC current in line 330 from being fed into junction 315, and thus back to the base of Q204.

A positive feedback to the demodulator 82 is further provided from the feedback circuit 20 (see FIG. 3) through optical isolator U206, a type 4N25. Resistor R224 is provided between the output of the opto-coupler U206 and the non-inverting input of the amplifier U201 to introduce controlled hysteresis into the demodulator switching point. Load resistor R233 is also coupled between the opto-coupler U206 output and the shield line 209. The opto-coupler U206 is driven by an output from transistor Q206. A voltage supply line 99 from the power supply 58 powers Q206. The base of Q206 is coupled with the output of multiplexer 88 in the feedback circuit 20 (see FIG. 3).

Figure 4D:
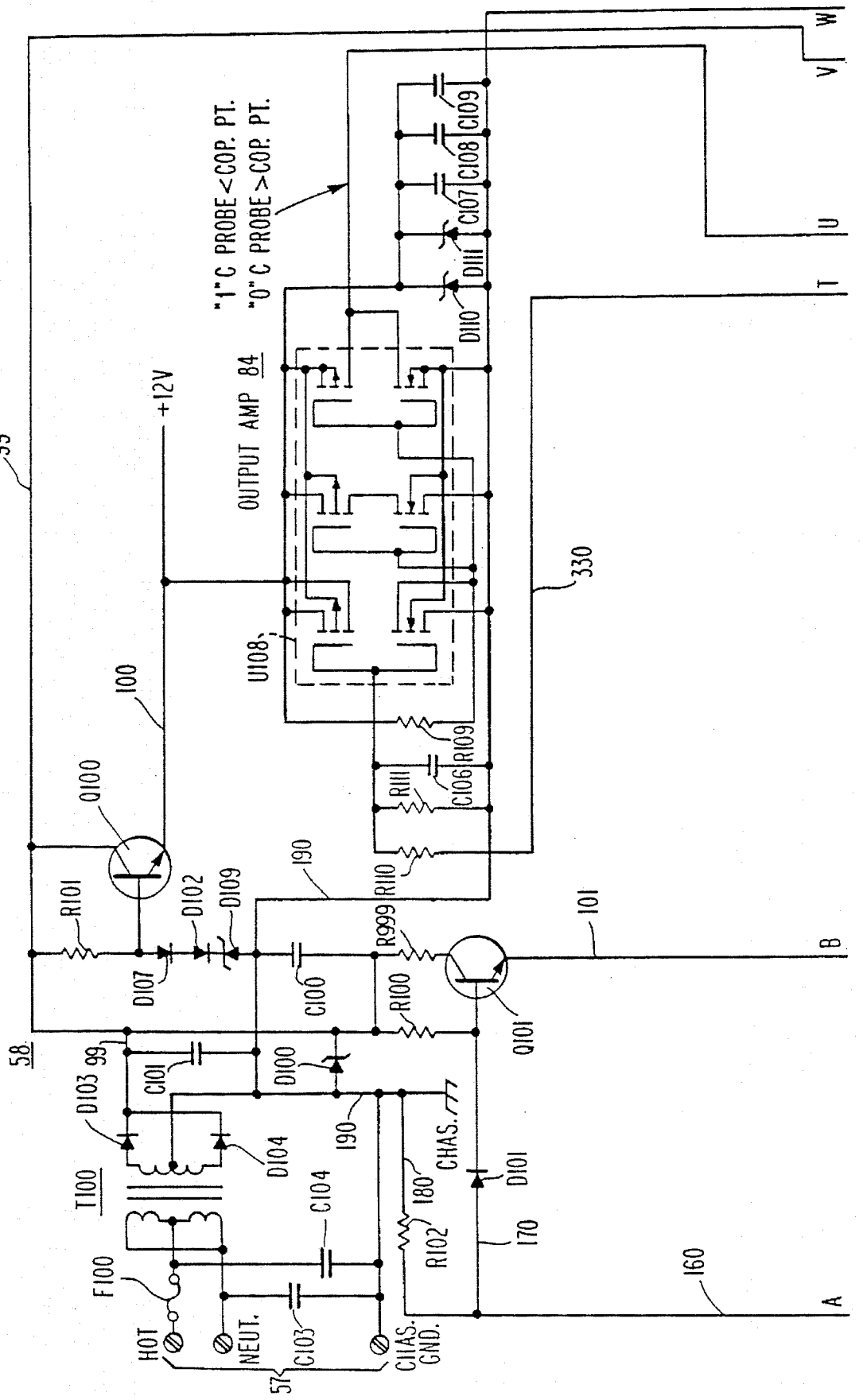
FIG. 4d a schematic of the output amplifier and power supply of the first embodiment.

Referring now to FIG. 4d, the circuit associated with the output amp 84 is depicted. This includes an integrated circuit U108, type CD4007, containing a six transistor array which is coupled between a +12 volt power supply line 100 and a ground return line 190. Resistors R110–R111 and capacitor C106 together provide biasing and filtering of the demodulator output. Zener diodes D110 and D111 and capacitors C107–C109 provide overvoltage and spike protection and local filtering of the +12 volts supply to the output amp and digital components coupled with +12 volt line 100.

The output of the amp 84 is a bi-level or logic level signal fluctuating between 12 volts and ground and is carried on line 85 to the output circuits 90 and feedback circuit 20. In particular, the output amp output signal is carried to the data input of a latch 86 constituting part of the feedback circuit 20 of the system.

Figure 4E:
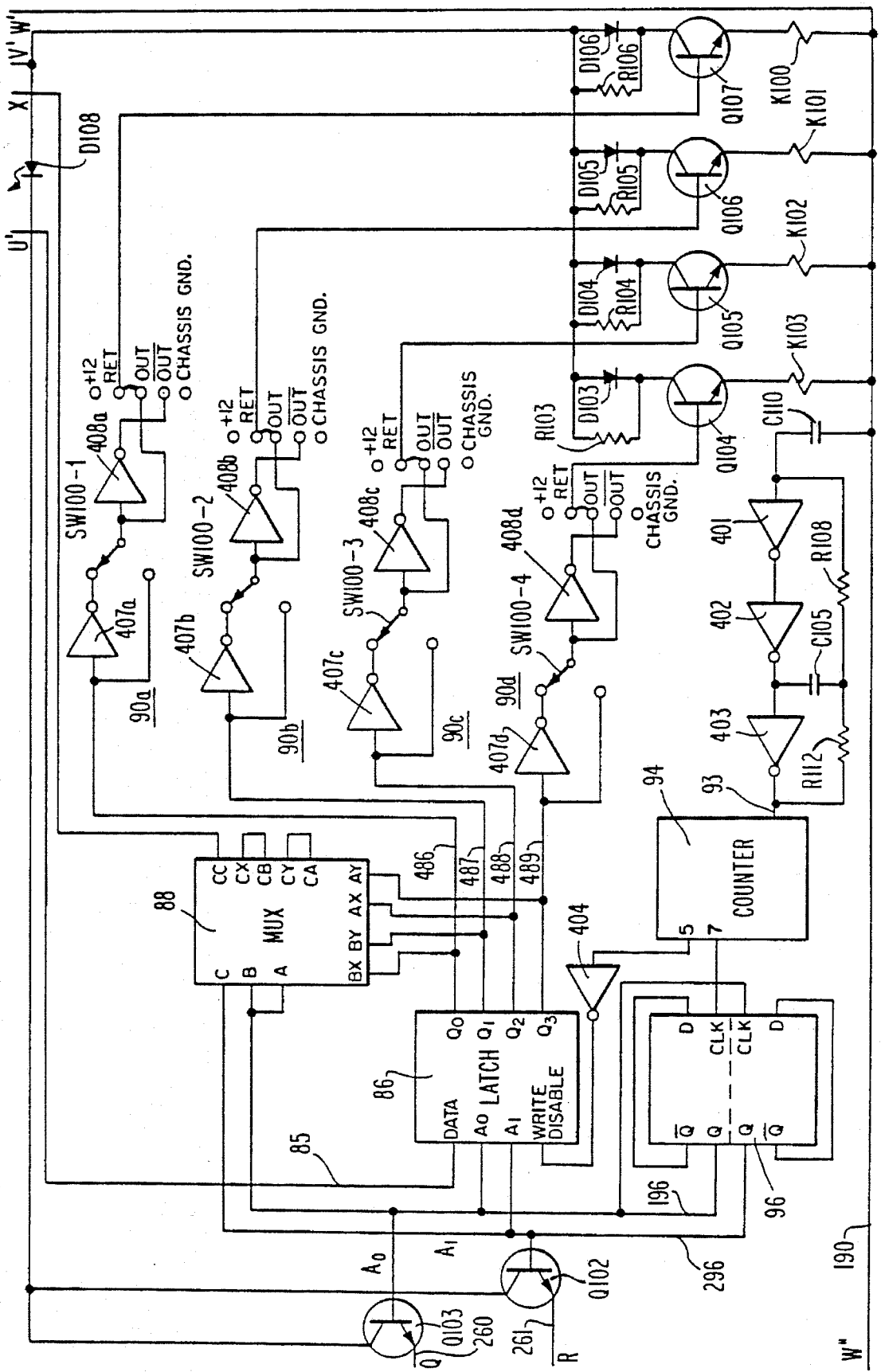
FIG. 4e is a schematic of the address generator, feedback and output circuits of the first embodiment.

Referring now to FIG. 4e, there are depicted the components of the feedback circuit 20, the controller 22 and output circuits 90. At the bottom center of the figure, the clock 92 of FIG. 3 is provided by the well-known three-inverter multivibrator formed by capacitances C105 and C110, resistors R108 and R112 and three inverters 401, 402 and 403 of six inverters on a CMOS Schmitt inverter, type CD40106. A 40 hertz square wave is generated by the clock and is passed on line 93 to the input of a CMOS decade counter (or divider) 94. The divider divides the 40 hertz signal by ten and outputs two signals 50 milliseconds apart on the "5" and "7" outputs. One signal, generated 125 milliseconds after the start of the count cycle, is passed through another inverter 404 to the write disable pin of latch 86. A second signal, occurring 175 milliseconds into the cycle, is passed to a clock input of an address generator 96 formed by a CMOS dual flip-flop chip, type CD4013. The flip-flop 96 outputs two address signals $A_O$ and $A_1$ on lines 196 and 296, respectively. The address signals are carried to two of the three address lines of the octal latch 86 and to the address lines of a CMOS multiplexer 88, type CD4053. Each of the address lines 196 and 296 is also carried to the bases of transistors Q103 and Q102, respectively. The emitters of these transistors pass fluctuating current signals on lines 260 and 261 to each of the optical isolators e and f, respectively, in the dual opto-isolator device U205 of the decoder circuit 98 (see FIG. 4b). Load resistors R200 and R201 (see FIG. 4b) return current from the LED's of optical isolators e and f to ground line 190. The first (125 millisecond) counter signal causes the octal latch 86 to write the high or low state of the output amp output signal into the storage element addressed by address lines $A_0$ and $A_1$. The latch 86 therefore stores the bi-level characteristic of the output amp signal for each of the adjustable capacitors C227 through C230 in turn as it is coupled into the bridge. Fifty milliseconds later, the second (175 millisecond) counter signal causes the address generator 96 to increment the address, switching a new capacitor into the bridge. The system is given two-tenths of a second to stabilize before the then current state of the output amp signal is again written into another storage element of the latch. The latch 86 outputs, on each of four lines 486–489, the bi-level states of the system with respect to each of the four set points controlled by each of the four capacitors C227–C230. Multiplexer 88, under the control of the address lines 196 and 296, selects the latch output signal corresponding to the particular capacitor C227–C230 currently switched into the variable side of the bridge and outputs that signal to the base of the transistor Q206. The output of transistor Q206 is passed through the opto-coupler U206. As was explained earlier with respect to the demodulator circuit, the output of the opto-coupler U206 is passed to the demodulator amp for positive feedback. Opto-coupler U206 and assembly U205 with opto-couplers e and f are provided to electrically isolate the components of the bridge, error amp and demodulator from the feedback and controller circuitry for intrinsic safety considerations. If desired, other conventional means, such as transformers, might be provided for the same function.

Coupled with each of the four output lines from the addressable latch 86 is an output circuit 90a–90d, respectively. These output circuits are conventional and identical. Therefore, only the components at 90a will be described. Each includes one of a first inverter 407a–407d and a second inverter 408a–408d, respectively, all type CD40106. A switch SW100-1 through SW100-4 is provided for selecting either the output from the latch for high level fail safe switching or the output from the first inverter 407 for low level fail safe switching. The output of the switch 64 is passed through and around the second inverter 408 to a plurality of conventional time-delay module connections. An output from one of these connections is carried, in the depicted embodiment, to the base of an associated transistor Q104–Q107. Each transistor is controlled to activate an associated LED D103–D106, respectively, while energizing the coil of a conventional, double-pole, double-throw relay. Each of the relays K100–K103 is provided with 2 sets of three contacts (not shown for simplicity) coupled with external connectors. Line 99 from the power supply 58 provides approximately 20 volts DC and is used to power the relays K100–K103, the optical isolators U205 and U206, transistors Q102–Q107 and Q206, as well as an LED D108 located in the line supplying current to Q102 and Q103. Diode D108 switches in the sequence, from high-low-low-off, in response to the current drawn through the transistors Q102 and Q103 under the control of the address generator U103.

Referring again to FIG. 4d, the circuitry of the power supply 58 is depicted. The power supply 58 is conventional. A three-line AC power source 57 (shown in FIG. 2) is converted to 28 VRMS center-tapped by transformer T100, rectified by diodes D103 and D104, stored in capacitor C101, and supplied as pulsating DC at about +20 volts to the remaining circuitry on line 99. Resistor/diode networks formed by R100, R101, R102, R999, D101, and D107, D102 and D109, supply DC at approximately +12 volts from Q100 on line 100 with respect to line 190 and +8.4 volts direct current on line 101 with respect to the line 160 from transistor Q101.

Figure 7:
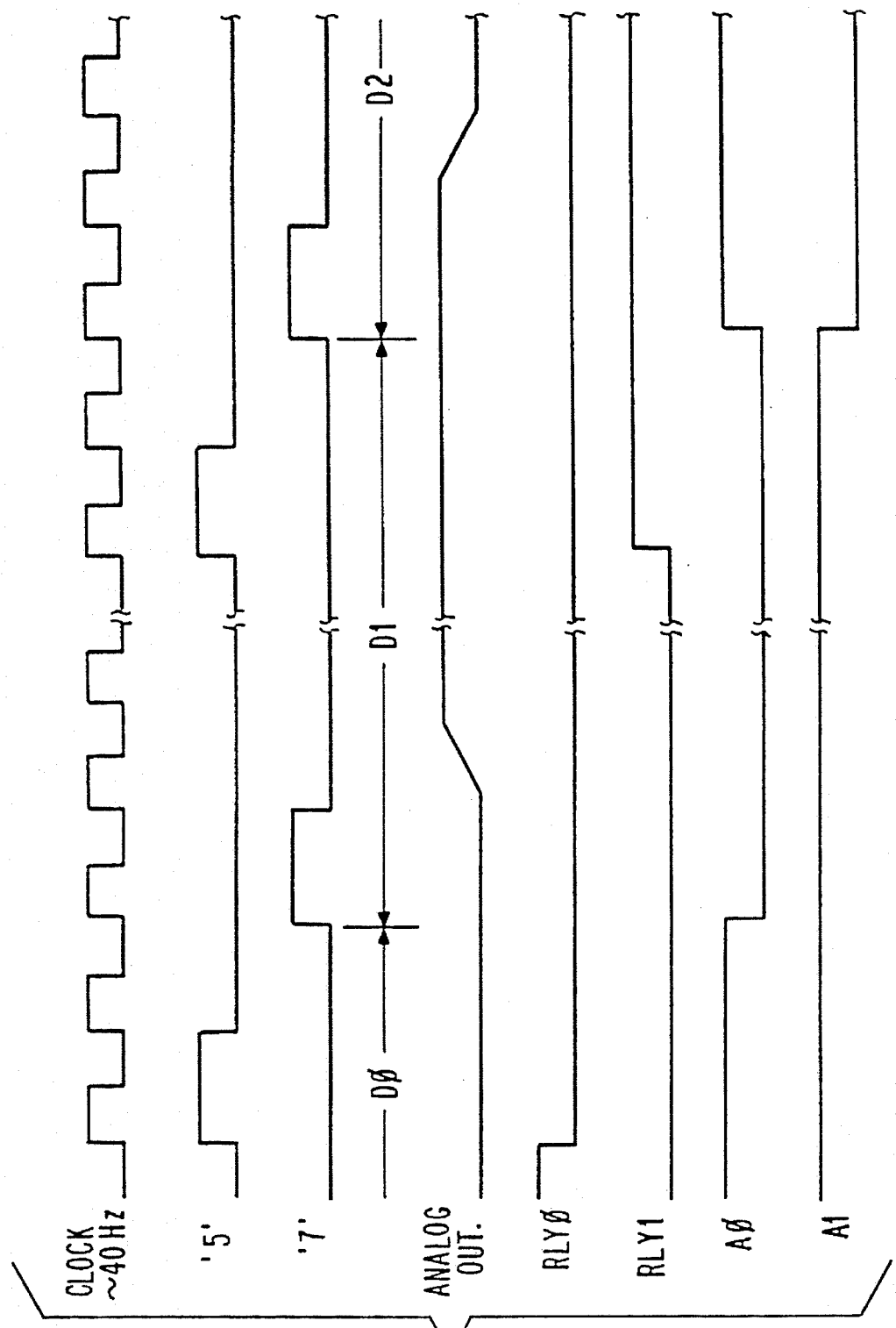
FIG. 7 depicts diagrammatically various timing and control signals of the first embodiment.

FIG. 7 depicts several of the timing and control signals employed by the system in relation to an output signal. The first line shows the 40 hertz squarewave signal output by the clock 92 of FIG. 3. The output of the signals on the "5" and "7" count outputs of the divider/counter are also depicted showing the signals go high at the 125 and 175 millisecond outputs of the clock 92, respectively. The analog output of the demodulator is initially low. Both address signals A0 and A1 are initially high and identify the first set point. When the "5" output goes high, the latch 86 sets the output amplifier output (which would be low) to a first storage element, outputting the first reference admittance/first set point output signal RLYO. The "7" output then goes high, causing the AO signal to go low, identifying the second reference admittance to be coupled into the variable side of the bridge network. That capacitor causes the analog output of the demodulator to go high. Stabilization is allowed before the "5" output again goes high. The high output of the demodulator is stored in a second storage element of the latch and causes an output signal RLY1 to be high. The "7" output from the divider/counter 94 again goes high causing the AO signal to go high, triggering the A1 signal to go low and identifying a third capacitor to be coupled into the bridge network. The process is repeated for the third and a fourth capacitor, and begun again for the first capacitor.

Although a preferred first embodiment of the invention has been described, variations of the preferred embodiment will be apparent to those of ordinary skill in the art, including those described below with respect to the second embodiment. For example, other oscillators, bridges, error amps and output amps may be provided. In place of the demodulator, other conventional phase sensitive detection circuits may be provided. Moreover, other known circuit arrangements can be substituted for the described feedback circuit 20 and the controller 22. For example, in a two-set point monitoring system, the address generator might be formed by a single flip-flop and the entire decoder network previously described, eliminated. Furthermore, although a plurality of capacitors and switches in series have been described for the preferred reference admittance generator, other circuits and devices for automatically generating a series of different capacitances or admittances automatically might be substituted with appropriate modifications.

Figures 9, 10:
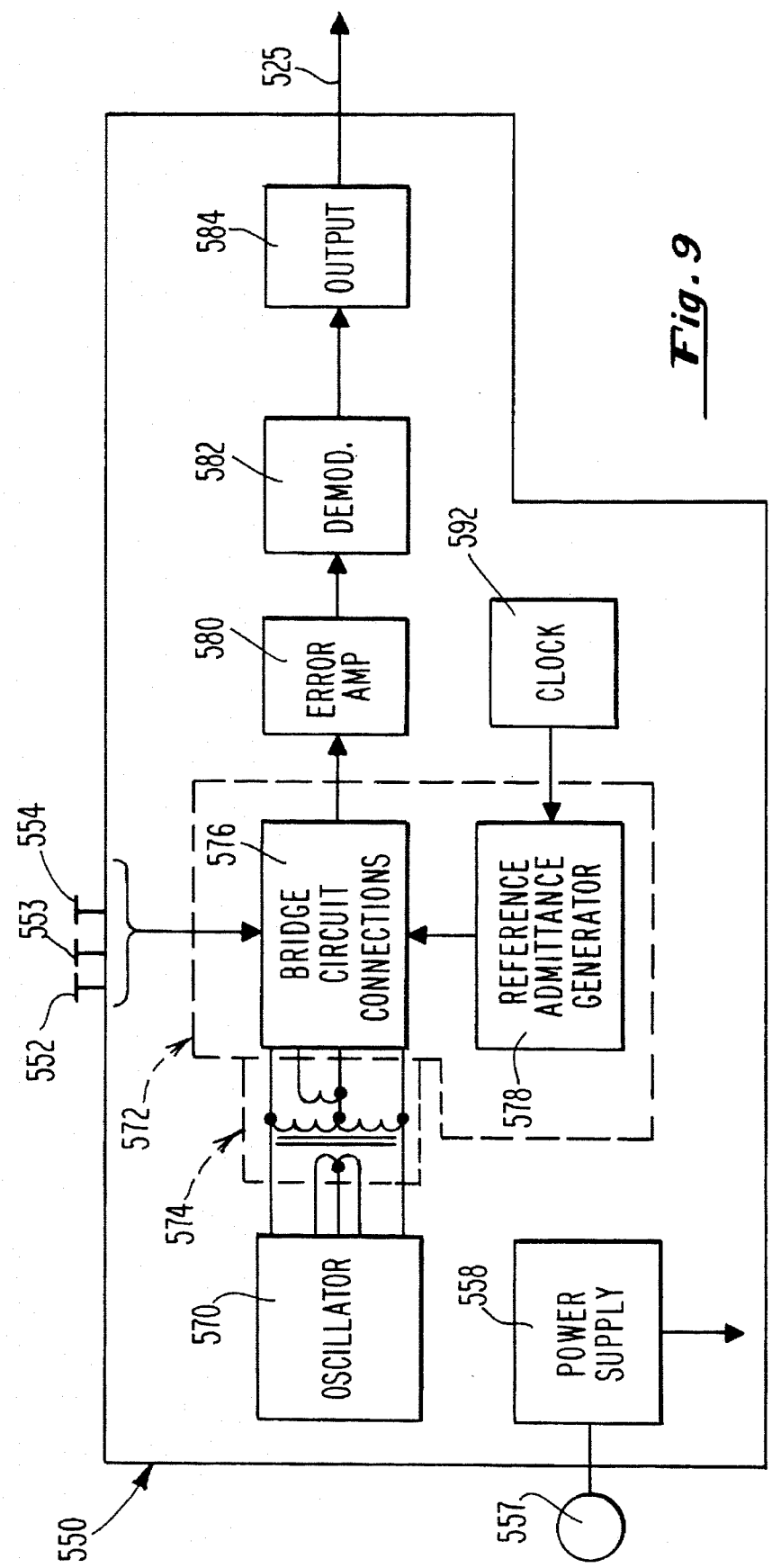
FIG. 9 is a more detailed block diagram of a second embodiment of the invention
FIG. 10 is a composite diagram illustrating the relative positions of FIGS. 10a–10d, a schematic diagram of the second embodiment.

FIG. 9 depicts in block diagram form the major functional components of a second embodiment of the invention. An external power source 557, which may be A.C. or D.C., is coupled to power supply 558 for supplying power to the remainder of the circuitry in an appropriate form. An oscillator 570 is coupled to transformer 574 for energizing bridge 572. Transformer 574 may comprise a part of oscillator 570. Bridge 572 is coupled to a material responsive sensor by connections 552–554, and includes a reference admittance generator 578 coupled to clock 592. Clock 592 causes generator 578 to assume a predetermined sequence of admittance values, which in this embodiment form the means for automatically and repeatedly varying a bridge parameter. The bridge output is coupled to error amplifier 580, which is included because the output of bridge 572 is typically too small to be reliably further processed. The output of error amplifier 580 is coupled to demodulator 582 for extracting useful information from the amplified bridge output signal. Demodulator 582 is desirably a phase-sensitive detector, whereby its output may be made responsive to bridge outputs caused by a conductance, a susceptance, or a combination thereof. The output of demodulator 582 is coupled to an output circuit 584 for generating one or more output 525 relating to the monitored material condition based upon the demodulated amplified bridge output. Desireably, either demodulator 582 or output means 584, or both, includes positive feedback so as to provide definite output states despite the continuous variability of the system input.

A detailed schematic diagram of a preferred second embodiment of the invention is shown in FIGS. 10a–10d, which are oriented as shown in FIG. 10 to form a complete schematic diagram.

Figure 10A:
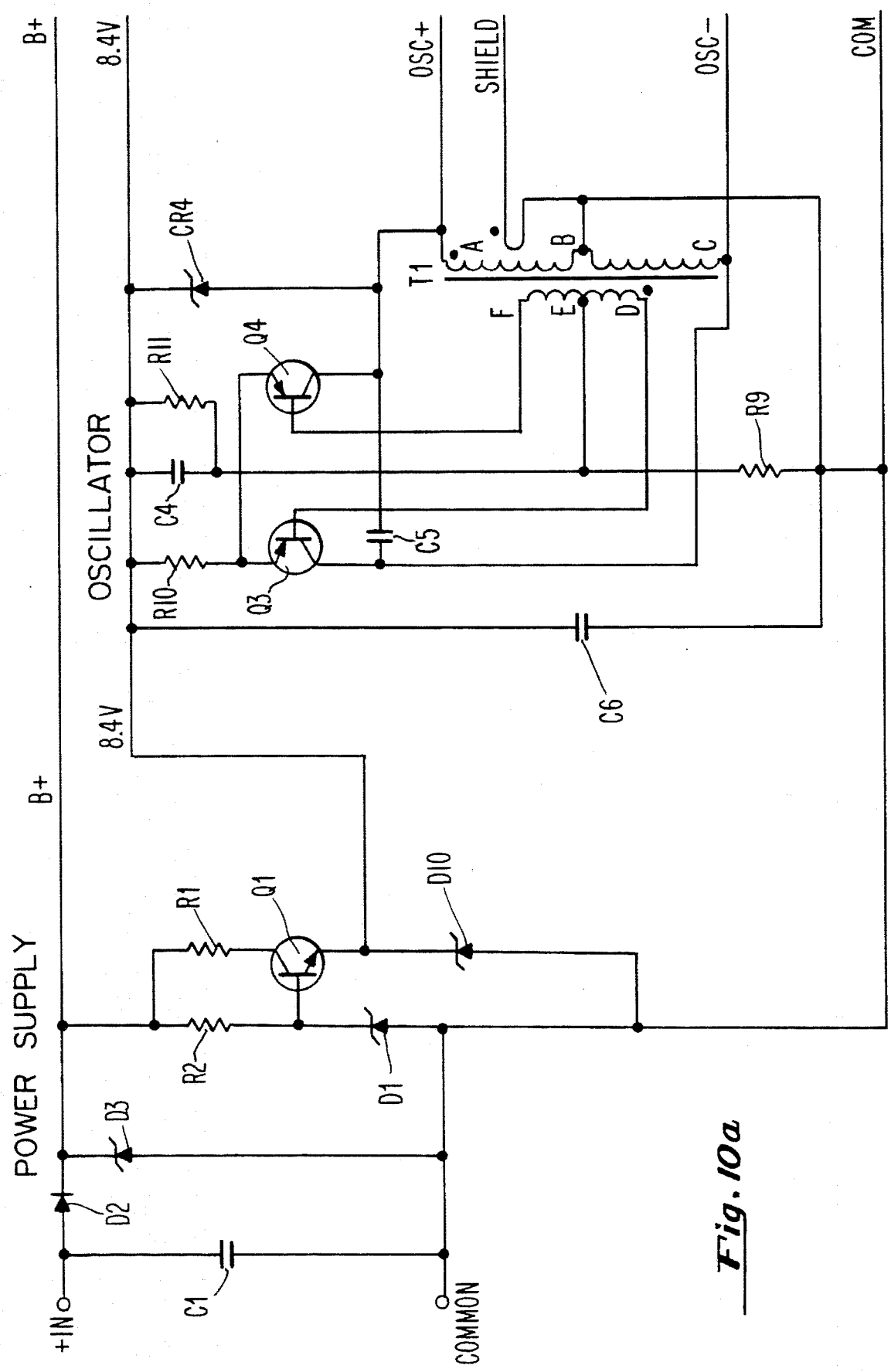
FIG. 10a is a schematic diagram of the power supply and oscillator of the second embodiment.

FIG. 10a depicts the power supply and an oscillator circuits of the preferred second embodiment of the invention. Power supply 558 is configured to receive a D.C. input between its +IN and common terminals. C1 filters A.C. noise present on the supply inputs, D2 provides reverse polarity protection, and D3 protects the circuitry against input overvoltage, resulting in an unregulated supply potential designated B+ with respect to common. A voltage regulator coupled to B+ generates a regulated voltage, designated 8.4 V, as follows. R2 supplies current to zener diode D1, establishing a voltage which is buffered by emitter follower Q1 coupled to 8.4 V. R1 provides current limiting, and D10 provides overvoltage protection for the regulated 8.4 V line.

An oscillator including transformer T1 is energized by the 8.4 V supply. With the exception of the transformer T1, the oscillator is identical to that described in the first embodiment, and its operation will not be further discussed. The transformer T1 differs from transformer 74 in that the shield potential is derived from a separate winding, rather from a tap on the secondary winding. This is desirable to permit minimizing the source impedance of the shield source and maintaining the bridge output invariant with shield loading, so that the system may be used with a wide variety of material conductivities and sensor geometries, including those which present a high conductance between the shield and ground electrodes. The oscillator generates three alternating potentials with respect to common. These are designated OSC+, shield, and OSC−, which has the opposite phase of OSC+.

Figure 10B:
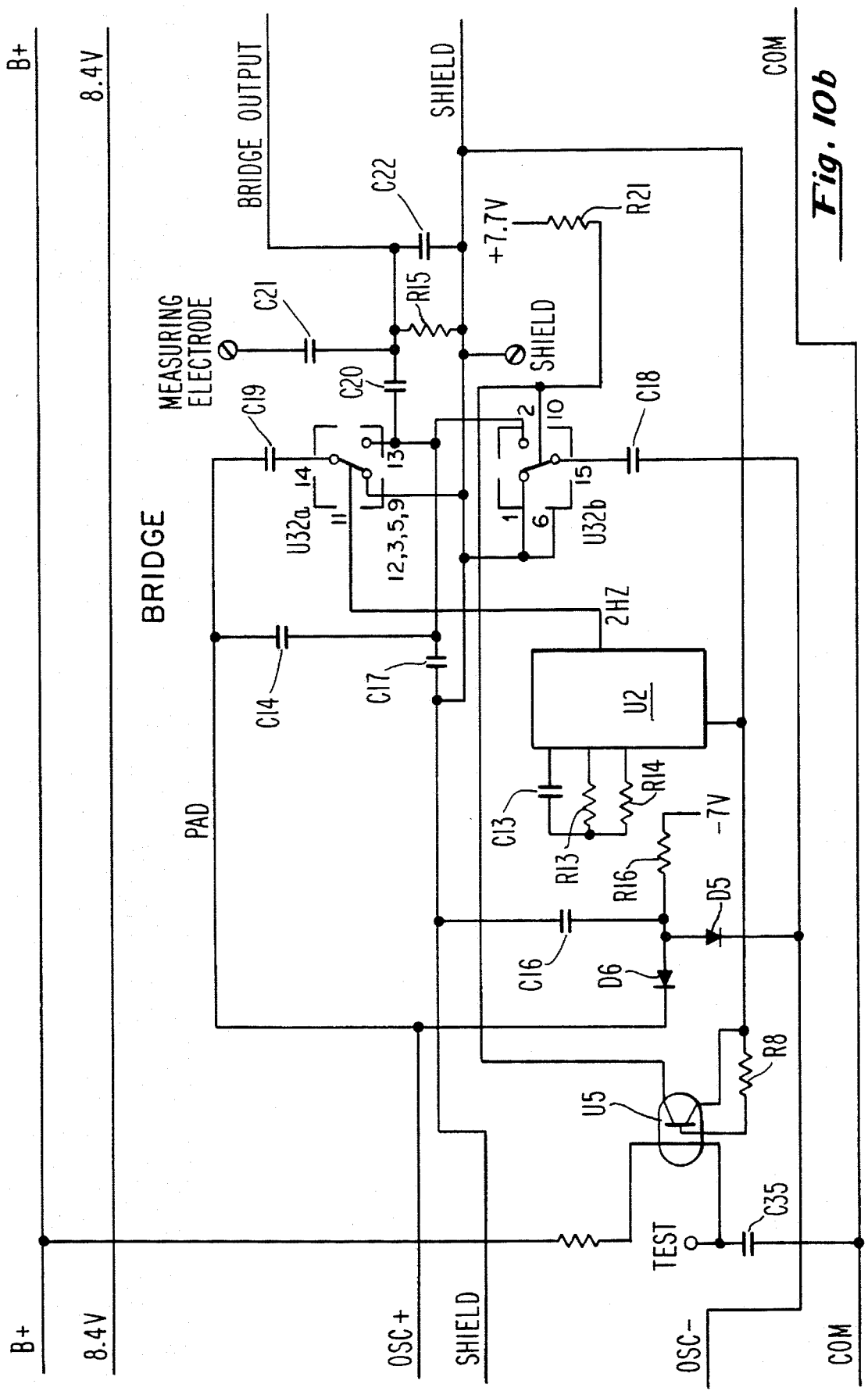
FIG. 10b is a schematic diagram of the bridge of the second embodiment.

The oscillator outputs are coupled to a bridge circuit, depicted in FIG. 10b. The bridge depicted is of the type shown in Fib. 8b, i.e., one in which the signal presented to the measuring electrode is a voltage having a relatively low source impedance at material conditions of interest, generated by the shield-to-ground voltage working into an admittance divider comprising the effective material admittances $Y_1$ and $Y_3$.

The bridge includes a clock comprising integrated circuit U2, type CD4060. U2 includes three inverters which are coupled with C13, R13, and R14 as an astable multivibrator. U2 further includes binary dividers which are coupled to the multivibrator to yield the clock output indicated as Q. The period of clock output Q is desirably sufficiently longer than the response time of the remainder of the circuitry that the system can properly respond to any input presented within one half of the clock period. Because the clock can modulate the system output under certain input conditions, and such modulation forms one output state of the system of the second embodiment, it may be desired to select the clock period so that the modulation occurs at a visually perceptible frequency. Applicant has found that a frequency of 2 Hz is suitable for these purposes in a system according to the second embodiment. The clock output Q is used to actuate a switch U3a, formed of one-half of U3, type CD4053, the effect of which is described below.

The bridge includes an admittance divider formed of C14 and C17 which form at their junction a source intermediate in open circuit voltage between shield and OSC+. This source is coupled to one end of C20, the other end of which is a bridge output and coupled to one input of error amplifier 580. Coupled between that input and measuring electrode terminal 52 is C21. Thus, in the terminology of FIG. 8b, the voltage at the junction of C14 and C17 forms voltage source 508, the source admittance of this source combined with the admittance C20 forms admittance element 512, and C21 forms admittance element 514. Thus, the bridge is balanced when the current flowing through C20 equals the product of the admittance of C21 and the difference between the shield voltage and the measuring electrode voltage.

The bridge further includes C19 coupled between OSC+ and the common terminal of an SPDT switch U3a. In the position shown, the switch couples the switched end of C19 to shield, where it has no relevant effect. In the other position the switch couples C19 in parallel with C14, thus adding to its admittance and altering the current sourced through C20 at balance. This in turn raises the measuring electrode to shield voltage differential which is required for balance, and accordingly alters the material condition which must exist for balance. In this way, in each portion of the clock cycle, a different material condition set point is established. If it is desired that a particular system have the capacity of varying the measuring electrode voltages required for balance, so as to accommodate differing sensor geometries and/or differing material conditions, bridge elements such as C14 and/or C19 may be made variable. Moreover, the set points may be made independently adjustable by separately switching C14 and C19 into the bridge. Further, as has been mentioned, the different set points may be established by an analog variable bridge element, such as a voltage variable capacitor, with the clock establishing varying control inputs.

R15 and C22 may be included between the bridge outputs to control and linearize the bridge gain.

Bridge 572 further includes means for testing proper system operation by simulating a material condition of interest, in this case a filled vessel 40. The testing means includes a second switch U3*b*, the common terminal of which is coupled through C18 to OSC−. As shown, the switch couples C18 to SHIELD, where it has no relevant effect. In the other position, C18 is coupled to the junction of C14 and C17, where (by appropriate choice of component values) it is sufficient to cause a bridge output corresponding to a high material condition. Thus when C18 is coupled to C41 and C17, the occurrence of an output corresponding to high level demonstrates that most of the system is functioning.

U3 is coupled to a positive shield-referenced supply, designated +7.7 and generated in a circuit to be described later, and to a negative shield-referenced supply, designated −7 V. The −7 V supply is generated by rectification by D6 and D5 of OSC+ and OSC−, and filtering by C16. R16 limits the current which may be drawn from −7 V. These supplies are also coupled to U2.

The switch controlling C18 is actuated by circuitry adapted to permit manual or automatic external switch control. The circuitry includes opto-isolator U5 to permit actuation by ground-referenced circuitry of the switch U3*b* which has a substantial radio frequency potential. U5, which may be a type 4N23a, includes an input LED coupled through current-limiting resistor R3 to the positive supply potential B+. The cathode of the LED is coupled to a test point, which when coupled to common permits current flow through the LED which biases the phototransistor of U5 into conduction. The control input of the test switch U3*b*, which is normally held high by coupling through R21 to the +7.7 potential, is pulled down to the shield potential by conduction of the phototransistor, and C35 attenuates noise on the test line which might activate the LED.

Figure 10C:
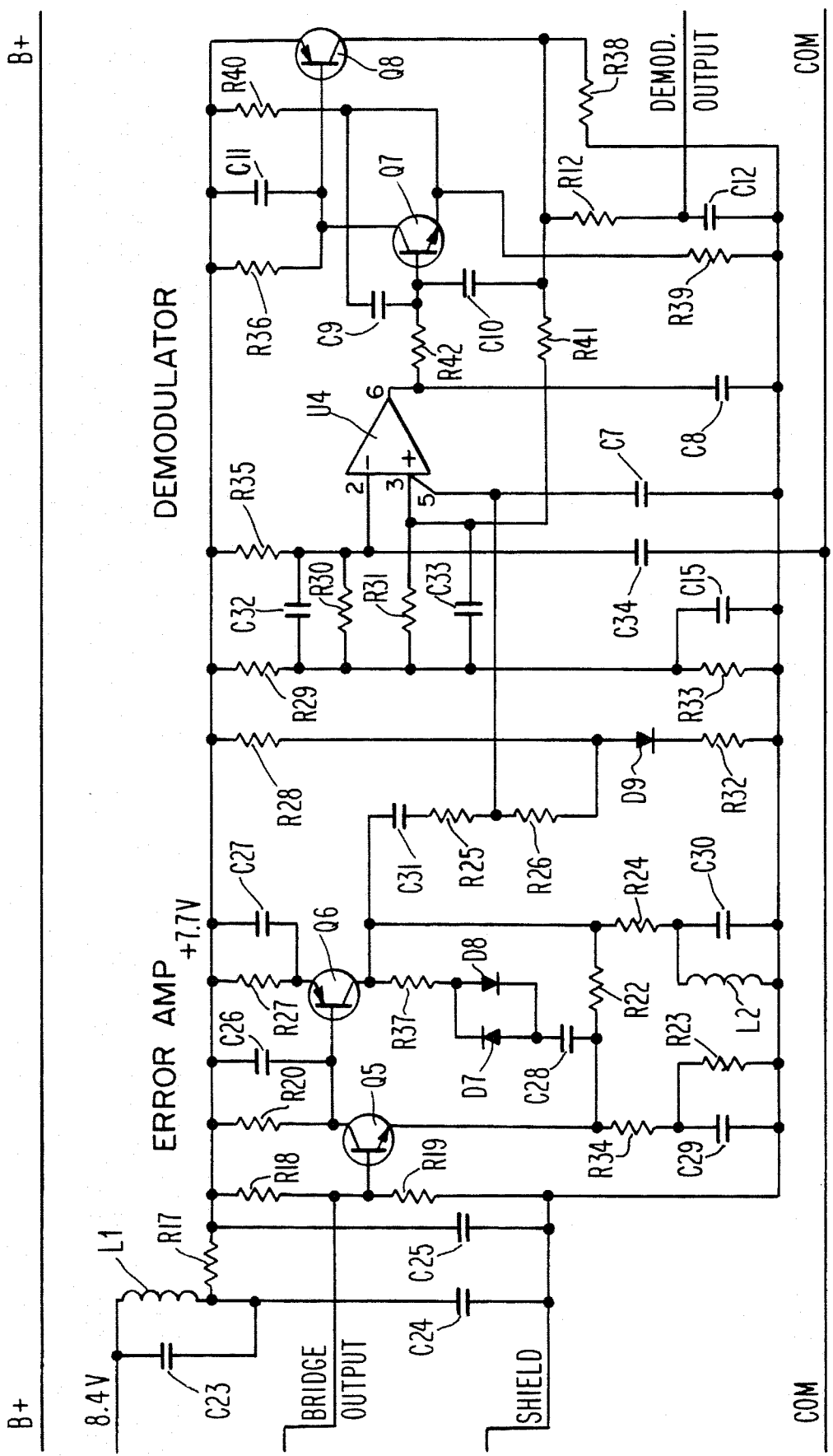
FIG. 10c is a schematic diagram of the error amplifier and demodulator of the second embodiment.

Referring to FIG. 10*c*, the error amplifier and demodulator of the second embodiment are shown, together with the circuitry generating the +7.7 V supply. The error amplifier and demodulator form a detector providing a bi-level output which changes state at a predetermined bridge condition, namely balance. As these circuits are quite similar to the corresponding circuits of the first embodiment shown in FIG. 4*c*, they will be only briefly described. The primary difference is the absence in FIG. 10*c* of the controlled feedback and multiple-breakpoint gain limiting circuitry of FIG. 4*c*.

L1, C23, R17, C24, and C25 form a filter whose input is 8.4 V with respect to common and whose output is, due to a load-induced filter losses, +7.7 V with respect to shield. This +7.7 V supply operates the error amplifier and demodulator, and is also used in the bridge as described above.

The bridge output, a voltage with respect to shield potential, is amplified by a compound Darlington amplifier including first transistor Q5 and second transistor Q6. The bridge output is coupled to the base of Q5, which is biased into conduction by R18 and R19. A.C. emitter load for Q5 is provided by R34; D.C. current is also controlled by R23, which is bypassed by C29 at the operating frequency. Collector load is provided by R20 and C26, the latter providing a gain rolloff for stability. The output of Q5 at its collector is coupled to the base of Q6, which includes in its emitter a resistor R27 to establish D.C. operating levels and a capacitor C27 which establishes A.C. emitter load. The collector load of Q6 is formed by R24 and an LC circuit which is parallel resonant at the operating frequency, comprising L2 and C30. This load rolls off the second stage gain at high and low frequencies, for stability, and permits the output to swing below the negative supply for increased dynamic range. Overall feedback is provided by R34 and R22; however, when the output increases sufficiently to cause conduction of D8 and D28, R22 is shunted and the incremental gain of the amplifier is reduced. This increases the input dynamic range of the error amplifier.

The demodulator 582 of FIG. 10*c* differs from that in FIG. 4*c* only in the omission of diodes D209–D212 from the bias network setting the gain of operational transconductance amplifier U4, and the omission of components R224, R233, and U206 which in the first embodiment establish feedback conditions relating to the output state when a particular bridge parameter was last selected. Instead, in the second embodiment, a single feedback element R41 is coupled from the output of the two-transistor switch Q7, Q8 to the positive input of U4. While the feedback scheme of the first embodiment might also be used, it is generally not necessary in monitoring of level and coating thickness conditions since it is unlikely that the setpoints will be close enough to cause the interaction which separate setpoint feedback eliminates. The output of the demodulator 582 is a two-state signal at the junction of R12 and C12, which is either pulled high when Q8 conducts or pulled low when Q8 does not.

Figure 10D:
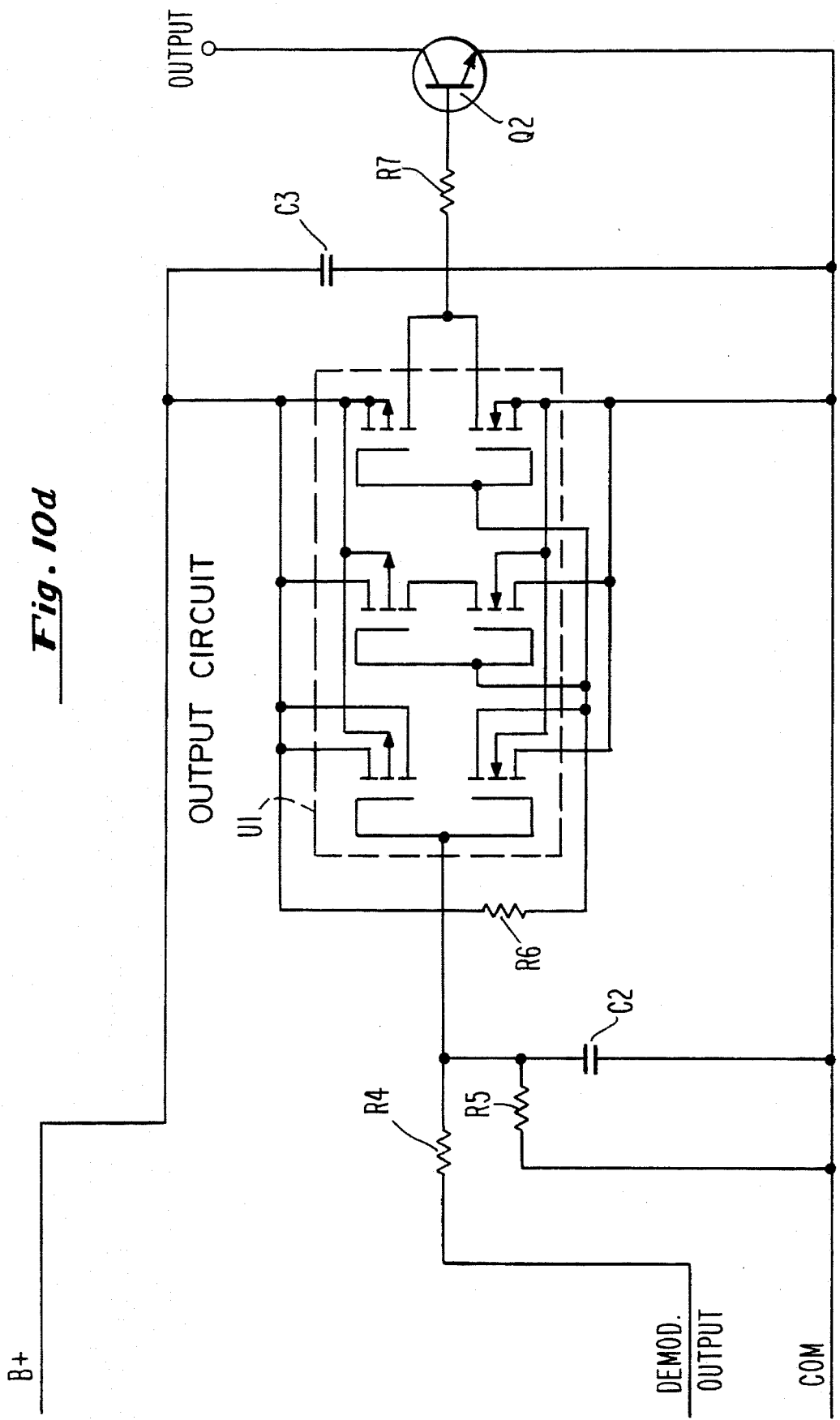
FIG. 10d is a schematic diagram of the output amplifier of the second embodiment.

The output circuit of the second embodiment is shown in FIG. 10*d*, and consists essentially of an amplifier formed of U1, type CD4007, and open collector output transistor Q2. The demodulator output is coupled to a divider and low pass filter network consisting of R4, R5 and C2 which is coupled to the gate of an n-channel transistor in U1 and removes the AC component of the shield-referenced demodulator output and ensures that high and low demodulator outputs will result in the transistor being substantially fully on and off, respectively. R6 limits the drain current of the transistor, which is coupled to the gates of a CMOS inverter, providing a low impedance bi-level output. This output is coupled to the base of output transistor Q2 through current limiting resistor R7. Q2 provides an open collector system output. If desired, the unused inverter may be used to provide a system output having an opposite sense.

Figure 11:
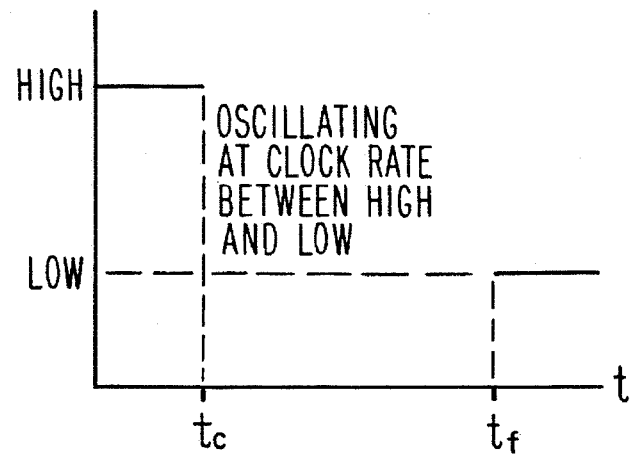
FIG. 11 is a graph illustrating the system transfer function of the second embodiment.

The overall system transfer function of the second embodiment is illustrated in FIG. 11. As described above with respect to FIGS. 12 and 10*b*, the system may be made to automatically and repeatedly vary its setpoints, for instance to respond to a sensor which is coated with a material thickness of interest and to respond to a sensor fully immersed in a full tank. These setpoints are indicated as $t_c$ and $t_f$, respectively, on the X axis. The Y axis represents the output state, i.e. high for high system output current and low for low system output current. For low level conditions, where the coating thickness is less than setpoint $t_c$, the bridge output is high regardless of the state of switch U3*a* leading to a steady high output. If a coating in excess of $t_c$ but less than $t_f$ has developed, and the tank is not full, the bridge output will be high when only C14 is switched into the circuit, but low when both C14 and C19 are switched into the circuit. Accordingly, the output will oscillate at the clock frequency between high and low, being effectively modulated by the clock. When the coating thickness is greater than $t_f$ or the sensor is covered by material, the bridge output will be low regardless of the state of switch U3*a*, and the system output will correspondingly be low. Accordingly, the system of the second embodiment provides a single output which has three possible output states. An advantage of the tri-state output signal provided is that a single display means such as an LED can display the three output states by assuming an off, flashing, or fully on state. It will be understood that the tri-state output intrinsically provided by the demodulator output or provided by the output circuit may be converted to other forms of tri-state output or to separate bi-level outputs for the two setpoints. For instance, a circuit may be provided for detecting an oscillating output and, upon its occurrence, cause a level output to assume a low-level state and a coating output to assume a high-level state.

Figure 13A:
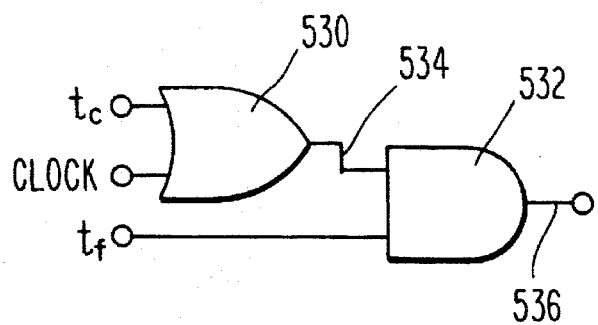
FIGS. 13a and 13b are schematic diagrams of output circuitry useful in the first embodiment of the invention to generate other useful output signals.
Figure 13B:
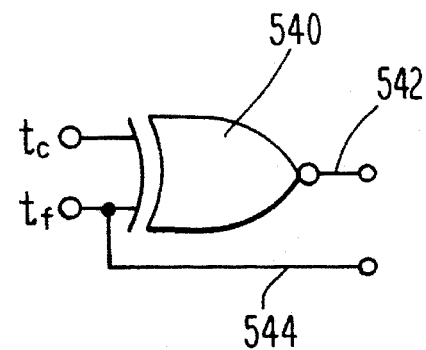

FIGS. 13a and 13b show circuitry for generating outputs which are functions of more than one setpoint of the first embodiment. FIG. 13a shows circuitry which may be used in conjunction with the separate outputs of the first embodiment to generate combined outputs of the sort generated by the second embodiment. The circuit has inputs $t_c$ and $t_f$, which may be received from a pair of outputs of latch 86 of FIG. 4e, which are high until the coating thickness and full vessel setpoints respectively are exceeded. The output 534 of OR gate 530 will remain high until setpoint $t_c$ is exceeded, whereupon the input $t_c$ will go low and output 534 will follow the clock input. The output of 536 of AND gate 532 will follow output 534 of OR gate 530 so long as setpoint $t_f$ has not been exceeded and input $t_f$ remains high; when input $t_f$ goes low, the output 536 is forced low. Accordingly, the output 536 will provide the same transfer function as is depicted in FIG. 11, and may be used to drive an open collector output transistor as in FIG. 10d or other appropriate devices.

FIG. 13b shows a circuit which may be used to provide an output 542 which assumes one state when the input is between the setpoints $t_c$ and $t_f$ and the other state at all other inputs. Exclusive OR gate 540 coupled to the $t_c$ and $t_f$ outputs provides just this function; its output, and the $t_f$ output, may be coupled to appropriate output devices.

It will be understood that, while the second embodiment is shown as a two setpoint system, it may be modified to provide further setpoints. For instance, additional switches may be provided in the bridge to couple in additional admittance elements for duty cycles unique to each admittance element. In this event, the output between the highest and lowest setpoint will be modulated by the clock component for each setpoint which has been exceeded.

It will also be understood that the circuit blocks of the second embodiment and the first embodiment generally may interchanged, as appropriate, as well as substituted for by other equivalents.

It will further be understood that while the single-sensor systems adapted to monitor both level and coating disclosed herein have the advantage that the coating is measured on the very sensor used to monitor level, and is conveniently implemented, equivalent results may be obtained with a pair of single setpoint monitoring systems which are otherwise as described herein. That is, on the assumption that a coating will accumulate uniformly on the interior of a vessel, a pair of single setpoint systems each having its own sensor may be appropriately disposed in the vessel. The setpoint of one may be adjusted for switching when a predetermined coating thickness has been exceeded, and that of the other for switching when fully covered.

What is claimed is:

1. A system for monitoring material, comprising:

a sensor producing, when disposed in a vessel containing a fluid material, a sensor signal which is responsive to the level of said material in the vessel and which is also responsive to the thickness of a coating of said material on said sensor;

a reference generator producing a reference signal having a value which varies among a plurality of reference signal values, including a reference signal value representing a material level setpoint and a reference signal value representing a sensor coating thickness setpoint; and an output signal generating circuit coupled to said sensor and to said reference generator, said output signal generating circuit comparing said sensor signal to said reference signal and producing a responsive output signal, wherein said output signal has one of at least three distinguishable states, including a first state representing high material level with respect to said material level setpoint, a second state representing low material level with respect to said material level setpoint, and a third state representing that the thickness of coating of said material on said sensor exceeds said sensor coating thickness setpoint.

2. A system according to claim 1, wherein said sensor includes a generally planar material sensing surface.

3. A system according to claim 1, wherein said sensor is an admittance sensor.

4. A system according to claim 1, wherein said output signal generating circuit includes a bridge.

5. A system according to claim 1, wherein said output signal generating circuit includes a radio frequency source coupled to said sensor and to said reference generator.

6. A system according to claim 1, wherein said reference generator includes a switch which, when actuated, varies said reference signal value.

7. A system according to claim 6, further including a switch controller coupled to said switch, said switch controller automatically and repeatedly actuating said switch.

8. A method of monitoring fluid material in a vessel comprising the steps of:

disposing a sensor in a vessel;

energizing the sensor to provide a sensor signal which is responsive to the level of fluid material in the vessel and which is responsive to the thickness of a coating of the fluid material on the sensor;

providing a level reference signal representing a material level setpoint and a coating thickness reference signal representing a sensor coating thickness setpoint;

comparing said sensor signal to said reference signals; and generating an output signal having one of at least three distinguishable states selected in accordance with the results of said comparing step, two of said states representing the material level with respect to said material level setpoint and one of said states representing the thickness of coating of the material on the sensor with respect to said sensor coating thickness setpoint.

9. A method according to claim 8, wherein said sensor disposing step includes disposing said sensor, having a generally planar surface, in said vessel so that said generally planar surface is substantially flush with an interior surface of the vessel.

10. A method according to claim 8, wherein said sensor energizing step includes applying a radio frequency signal to the sensor.

11. A method according to claim 8, wherein said sensor disposing step includes disposing an admittance sensor in said vessel.

12. A method according to claim 8, wherein said reference signal providing step includes actuating a switch to select one of said reference signals for comparison in said comparing step.

13. A method according to claim 12, wherein said reference signal providing step includes automatically and repeatedly actuating said switch.

14. A method according to claim 8, wherein said comparing step includes providing a bridge which compares said sensor signal with said reference signals.

15. In a process of monitoring the level of fluid material in a vessel using an instrument system including a sensor disposed in the vessel and an instrument coupled to the sensor which provides a level output signal representing the level of the material in the vessel, in which the sensor is subject to being coated by the material and in which a coating of the material on the sensor may interfere with the ability of the instrument to provide a level output signal which accurately represents the material level, a method of operating the instrument system comprising the steps of:

detecting in the instrument a coating of material on the sensor; and generating a coating output signal indicating the coating of material on the sensor, said coating- indicating output signal being different and distinguishable from said level output signal.

16. The method of claim 15, wherein said coating-indicating output signal represents the thickness of coating on the sensor.

17. The method of claim 16, wherein said coating-indicating output signal indicates whether the thickness of coating on the sensor exceeds a coating thickness setpoint.

18. The method of claim 15, wherein said instrument generates an output signal having one of at least three predetermined states, and said coating-indicating output signal generating step includes generating an output signal having one of said predetermined states.

\* \* \* \* \*